United States Patent
Tsao et al.

(10) Patent No.: US 11,450,700 B2
(45) Date of Patent: Sep. 20, 2022

(54) SEMICONDUCTOR IMAGE SENSOR PIXEL ISOLATION STRUCTURE FOR REDUCING CROSSTALK

(71) Applicant: Taiwan Semiconductor Manufacturing Co., Ltd., Hsin-Chu (TW)

(72) Inventors: Tsun-Kai Tsao, Tainan (TW); Jiech-Fun Lu, Madou Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 79 days.

(21) Appl. No.: 16/942,109

(22) Filed: Jul. 29, 2020

(65) Prior Publication Data

US 2022/0037387 A1 Feb. 3, 2022

(51) Int. Cl.
    *H01L 27/146* (2006.01)
(52) U.S. Cl.
    CPC .... *H01L 27/14623* (2013.01); *H01L 27/1463* (2013.01); *H01L 27/14683* (2013.01); *H01L 27/1464* (2013.01); *H01L 27/14627* (2013.01); *H01L 27/14629* (2013.01)
(58) Field of Classification Search
    CPC ......... H01L 27/14623; H01L 27/14683; H01L 27/14627; H01L 27/14629; H01L 27/1464
    See application file for complete search history.

(56) References Cited

U.S. PATENT DOCUMENTS

| | | |
|---|---|---|
| 9,443,899 B1 | 9/2016 | Liu et al. |
| 10,438,980 B2 | 10/2019 | Huang et al. |
| 10,510,910 B2 | 12/2019 | Wu et al. |
| 10,553,733 B2 | 2/2020 | Huang et al. |
| 2012/0286418 A1* | 11/2012 | Lee .................... H01L 24/81 257/737 |
| 2018/0331159 A1 | 11/2018 | Lee et al. |

(Continued)

OTHER PUBLICATIONS

Agranov et al. "Crosstalk and Sub-Pixel Distribution of Sensitivity in Color CMOS Image Sensor" 2001 IEEE Workshop on Charge-Coupled Devices and Advanced Image Sensors, published on Jun. 7, 2001.

(Continued)

*Primary Examiner* — Nelson Garces
(74) *Attorney, Agent, or Firm* — Eschweiler & Potashnik, LLC

(57) ABSTRACT

In some embodiments, the present disclosure relates to an image sensor structure. The image sensor structure includes a substrate. The substrate includes a first side and a second side opposite the first side. A photodetector extends into the first side of the substrate. An isolation structure comprises a first isolation segment and a second isolation segment that extend through the substrate. The first isolation segment and the second isolation segment are respectively on opposite sides of the photodetector and comprise a dielectric. A first metal line is on the first side of the substrate. A dummy contact structure comprises a first dummy segment and a second dummy segment. Both the first dummy segment and the second dummy segment comprise metal and extend from the first metal line to the first isolation segment and the second isolation segment, respectively.

20 Claims, 19 Drawing Sheets

(56) References Cited

U.S. PATENT DOCUMENTS

| | | |
|---|---|---|
| 2019/0096929 A1 | 3/2019 | Chiang et al. |
| 2019/0140006 A1* | 5/2019 | Cheng ............... H01L 27/14685 |
| 2019/0157323 A1 | 5/2019 | Ogi et al. |
| 2019/0252466 A1* | 8/2019 | Yoo ......................... H01L 51/42 |
| 2020/0021754 A1* | 1/2020 | Borthakur ........... H01L 27/1463 |
| 2020/0066768 A1 | 2/2020 | Cheng et al. |
| 2020/0111831 A1 | 4/2020 | Choi et al. |
| 2020/0227455 A1 | 7/2020 | Lee et al. |
| 2020/0403025 A1* | 12/2020 | Kim .................. H01L 27/14603 |
| 2021/0143196 A1 | 5/2021 | Uchida et al. |

OTHER PUBLICATIONS

Wit et al. "A Common Gate Pinned Photodiode Pixel." Semantic Scholar, published in 2011.

Hasegawa et al. "A New 0.8μm CMOS Image Sensor With Low RTS Noise and High Full Well Capacity." International Image Sensor Society session on stacking and small pixels, published in 2019.

\* cited by examiner

SEMICONDUCTOR IMAGE SENSOR PIXEL ISOLATION STRUCTURE FOR REDUCING CROSSTALK

BACKGROUND

Integrated circuits (ICs) with image sensors are used in a wide range of modern day electronic devices, such as, for example, cameras and cell phones. In recent years, complementary metal-oxide-semiconductor (CMOS) image sensors have begun to see widespread use, largely replacing charge-coupled device (CCD) image sensors. Compared to CCD image sensors, CMOS image sensors are favored due to low power consumption, small size, fast data processing, a direct output of data, and low manufacturing cost. Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
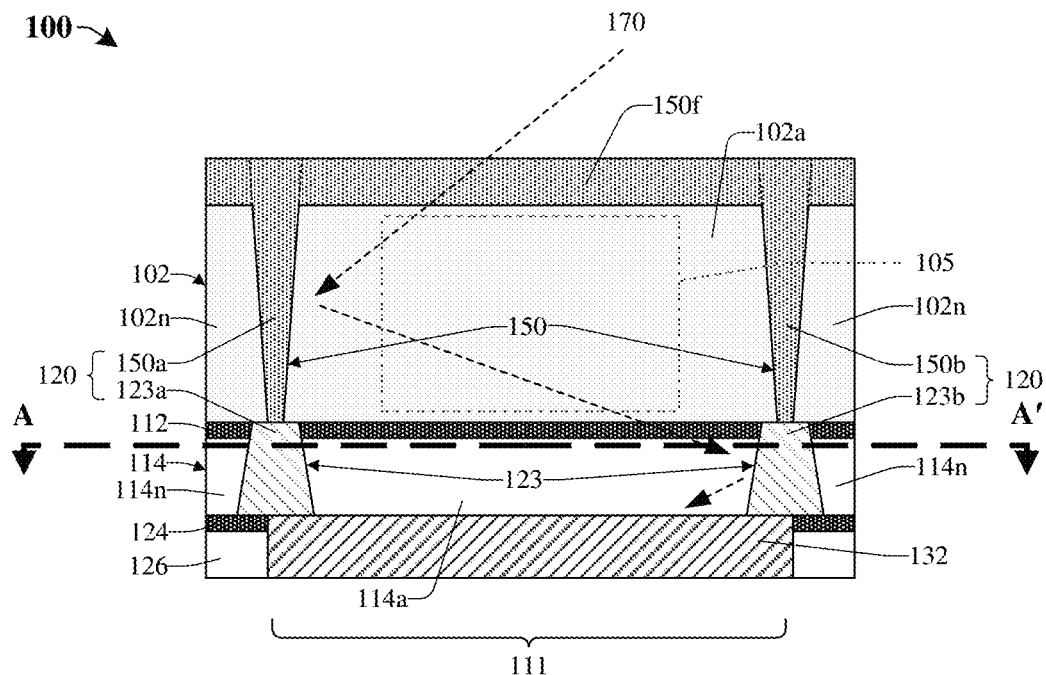
FIG. 1 illustrates a cross-sectional view of some embodiments of an image sensor including a pixel isolation structure, the pixel isolation structure comprising a dummy contact structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many modern integrated chips comprise image sensors. An image sensor may include a semiconductor substrate and a metal interconnect structure disposed on a front side of the substrate. Further, the image sensor may include a plurality of pixels. Each pixel includes a photodetector in the semiconductor substrate. Further, the pixels are separated from each other by a shallow trench isolation (STI) structure disposed in the front side of the substrate and a deep trench isolation (DTI) structure disposed in a back side of substrate opposite the front side. The DTI structure and the STI structure may be arranged along a common vertical axis. Further, the DTI structure and the STI structure may together extend vertically through the substrate at boundaries of the pixels to separate the pixels. As a result, photons entering a portion of a substrate corresponding to a pixel may be confined to the portion and prevented from entering other portions of the substrate corresponding to neighboring pixels.

A challenge with the image sensor is that while the DTI and STI structures may separate the pixels at the substrate, the DTI and STI structure do not separate the pixels at the interconnect structure. For example, a first dielectric layer of the interconnect structure that is disposed along the substrate may not be isolated at the boundaries between the pixels. As a result, some photons may travel between neighboring pixels via the non-isolated first dielectric layer. Thus, the STI and DTI structures intended to isolate neighboring pixels from one another may not prevent some photons from traveling between the neighboring pixels. This may, in turn, lead to high crosstalk between pixels and may decrease performance (e.g., quantum efficiency (QE)) of the image sensor.

Various embodiments of the present disclosure are directed towards an image sensor including a pixel isolation structure, the pixel isolation structure comprising a dummy contact structure for improving pixel isolation and reducing crosstalk between pixels. The image sensor may comprise a semiconductor substrate and a plurality of pixels along the substrate. A pixel of the plurality of pixels may comprise a photodetector in the substrate. The pixel isolation structure may include a substrate isolation structure disposed in the substrate and a dummy contact structure disposed in a first dielectric layer that together extend vertically through the substrate and through the first dielectric layer along a boundary of the pixel to separate a first region of the substrate and a first region of the first dielectric layer that are associated with the pixel from neighboring regions of the substrate and neighboring regions of the first dielectric layer that are associated with neighboring pixels. Thus, pixel isolation from neighboring pixels may be improved. As a result, the pixel isolation structure may reduce the likelihood that photons which enter the pixel will exit the pixel and enter a neighboring pixel. In turn, less cross talk may occur between neighboring pixels, thereby improving performance (e.g., QE) of the image sensor.

FIG. 1 illustrates a cross-sectional view 100 of some embodiments of an image sensor including a pixel isolation structure 120, the pixel isolation structure 120 comprising a dummy contact structure 123. The cross-sectional view 100 may, for example, be taken across the line A-A' illustrated in FIG. 2.

The image sensor comprises a pixel 111. The image sensor further comprises a substrate 102, a photodetector 105 in the substrate 102, a first etch stop layer 112 along a lower surface of the substrate 102, a first dielectric layer 114 along a lower surface of the first etch stop layer 112, a second etch stop layer 124 along a lower surface of the first dielectric layer 114, a second dielectric layer 126 along a lower surface of the second etch stop layer 124, and a first metal line 132 disposed within the second dielectric layer 126. In some embodiments, the first metal line 132 may be used as a metal reflector. In some embodiments, the image sensor may further comprise an interconnect structure (not labeled) below the substrate 102. For example, the interconnect structure may include the first dielectric layer 114, the dummy contact structure 123, and/or the first metal line 132, and may further include a number of other metal lines or vias (not shown).

Figure 2:
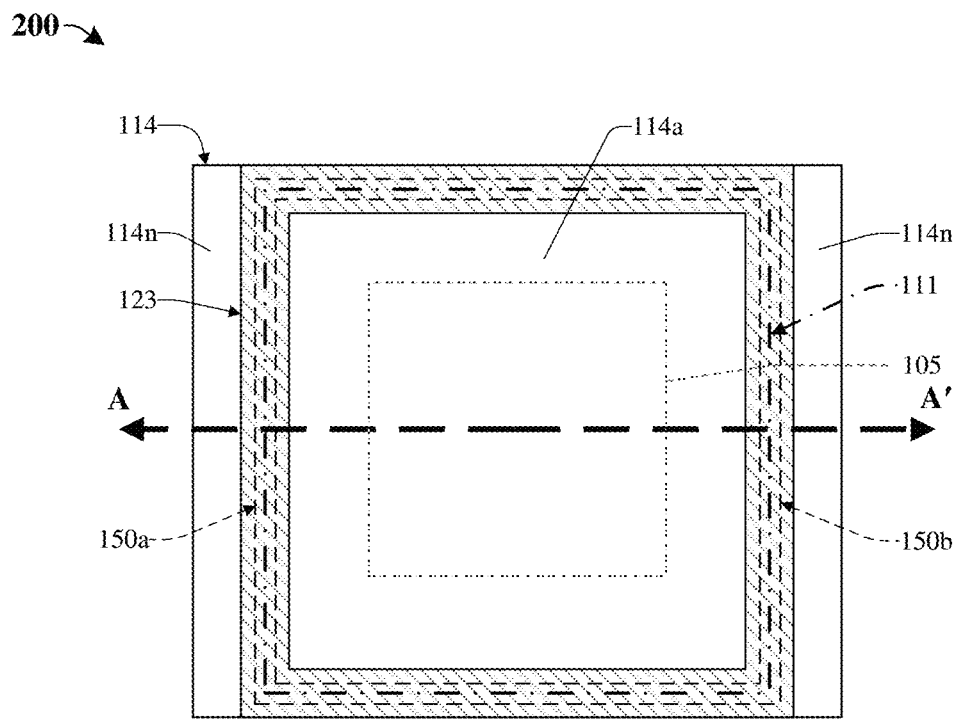
FIG. 2 illustrates an overhead view of some embodiments of the image sensor of FIG. 1.

The pixel isolation structure 120 comprises a substrate isolation structure 150 and the dummy contact structure 123. The substrate isolation structure 150 comprises a first isolation segment 150a and a second isolation segment 150b that extend vertically through the substrate along a boundary of the pixel 111. As a result, the first isolation segment 150a and the second isolation segment 150b laterally separate a first region of the substrate 102a from neighboring regions of the substrate 102n (and thus separate the photodetector 105 from neighboring photodetectors (not shown) that are in the neighboring regions of the substrate 102n). Moreover, sidewalls of the first isolation segment 150a and the second isolation segment 150b define the first region of the substrate 102a that comprises the photodetector 105. Further, the substrate isolation structure 150 may be a grid structure or a ring-like structure, as shown in FIG. 2. Furthermore, the substrate isolation structure 150 vertically extends from a top surface that is over the substrate 102 to a bottom surface that is below a top of the substrate 102. For example, the substrate isolation structure 150 comprises a front cover 150f that extends over a top surface of the substrate 102 between the first isolation segment 150a and the second isolation segment 150b. A photon 170 may enter the substrate 102 through the front cover 150f.

The dummy contact structure 123 comprises a first dummy segment 123a and a second dummy segment 123b that extend from the first metal line 132 to the first isolation segment 150a and the second isolation segment 150b, respectively. As a result, the first dummy segment 123a and the second dummy segment 123b laterally separate a first region of the first dielectric layer 114a from neighboring regions of the first dielectric layer 114n. In some embodiments, the pixel isolation structure 120 and the first metal line 132 completely enclose the first region of the substrate 102a and the first region of the first dielectric layer 114a.

The pixel isolation structure 120 may reduce the likelihood that a photon 170 which enters the pixel 111 will exit the pixel 111 and enter a neighboring pixel. The substrate isolation structure 150 reduces the likelihood of the photon 170 entering the neighboring pixel at the substrate 102. Further, the dummy contact structure 123 reduces the likelihood of the photon 170 entering the neighboring pixel at the first dielectric layer 114. Moreover, the dummy contact structure 123 together with the first metal line 132 may isolate the pixel at the interconnect structure (not labeled), thereby reducing the likelihood of the photon 170 entering the neighboring pixel at the interconnect structure. Thus, the pixel isolation structure 120 may improve an isolation of the pixel 111 from neighboring pixels. In turn, less cross talk may occur between the pixel 111 and neighboring pixels, thereby improving a QE and other performance metrics of image sensor.

In some embodiments, the substrate isolation structure 150 comprises one or more isolation materials. The one or more isolation materials may, for example, comprise silicon dioxide, silicon nitride, a low k dielectric, hafnium oxide, aluminum oxide, a high k dielectric, tungsten, aluminum, another suitable material, or any combination of the foregoing. In some embodiments, the substrate isolation structure 150 has a refractive index less than that of the substrate 102 to provide optical isolation via total internal reflection.

In some embodiments, the first isolation segment 150a, the second isolation segment 150b, and the front cover 150f may be integrally formed with same material, such as an oxide (e.g., silicon oxide), tetraethyl orthosilicate (TEOS), or the like. Further, an anti-reflective layer (not shown) may be disposed over the substrate 102 between the substrate 102 and the front cover 150f. The anti-reflective layer may also be disposed along sidewalls of the first isolation segment 150a and sidewalls of the second isolation segment 150b such that the anti-reflective layer is between the first isolation segment 150a and the substrate 102 and also between the second isolation segment 150b and the substrate 102. In some embodiments, the front cover 150f may have curved surfaces arranged over the photodetector 105 and intersecting one another.

In some other embodiments, the first isolation segment 150a and the second isolation segment 150b may be formed with different materials than the front cover 150f. For example, a reflective material may be disposed within the first isolation segment 150a and the second isolation segment 150b, such as aluminum (Al), rhodium (Rh), ruthenium (Ru), copper (Cu), silver (Ag), gold (Au), tungsten (W), cobalt (Co), iron (Fe), molybdenum (Mo), titanium (Ti), chromium (Cr), or any combination of the foregoing.

In some embodiments, the dummy contact structure 123 comprises a first metal material. The first metal material may, for example, comprise tungsten, copper, titanium, another suitable metal, or any combination of the foregoing.

The dummy contact structure 123 may have a greater width than the substrate isolation structure 150 at an interface between the dummy contact structure 123 and the substrate isolation structure 150 (i.e. along a top surface of the dummy contact structure 123). Further, the dummy contact structure 123 may have a height that is less than that of the substrate isolation structure 150. Furthermore, the dummy contact structure 123 may have some other surface geometries (e.g., multifaceted or bulbous in shape).

In some embodiment's, the image sensor is a CMOS image sensor or the like. In some embodiments, the substrate 102 may, for example, comprise a semiconductor material such as silicon or the like.

In some embodiments, the first dielectric layer 114 and the second dielectric layer 126 may, for example, comprise silicon dioxide, silicon nitride, a low k dielectric, another suitable dielectric material, or any combination of the foregoing. In addition, the first etch stop layer 112 and the second etch stop layer 124 may, for example, comprise silicon nitride, silicon carbide, silicon carbonitride, another suitable dielectric, or any combination of the foregoing.

In some embodiments, the first metal line 132 comprises a second metal material. The second metal material may, for example, comprise copper, aluminum copper, tungsten, another suitable metal, or any combination of the foregoing.

FIG. 2 illustrates an overhead view 200 of some embodiments of the image sensor of FIG. 1. A portion of the substrate isolation structure 150 in the substrate 102 may have a ring-shaped top layout. The ring-shaped portion of the substrate isolation structure 150 may extend along the boundary of the pixel 111 in a first closed path. The dummy contact structure 123 may be disposed directly below the ring-shaped portion of the substrate isolation structure 150 and may have the same top layout as the ring-shaped portion (i.e., the dummy contact structure 123 may be ring-shaped, may extend along the boundary of the pixel 111, and may extend along the first closed path).

In some embodiments, the first metal line 132, the dummy contact structure 123, and the substrate isolation structure 150 define a composite structure (not labeled) that extends vertically in a second closed path around the photodetector 105 (see, for example, FIG. 1).

Figure 3:
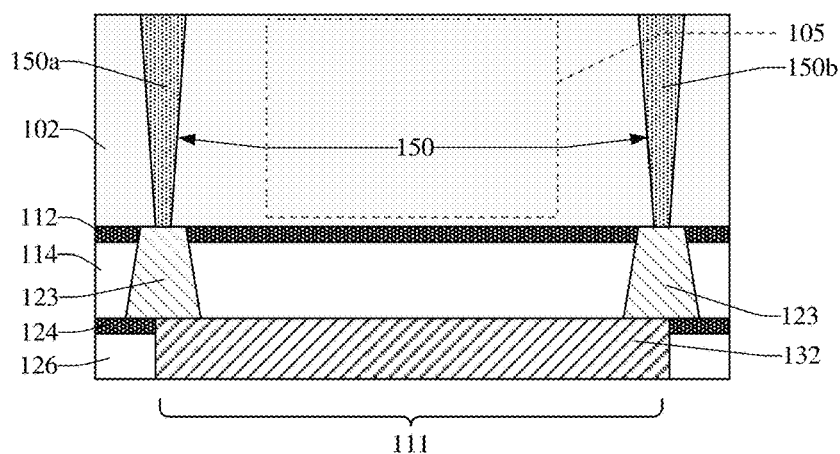
FIGS. 3-5 illustrate cross-sectional views of some additional embodiments of an image sensor including a pixel isolation structure, the pixel isolation structure comprising a dummy contact structure.

FIG. 3 illustrates a cross-sectional view 300 of some additional embodiments of an image sensor in which the substrate isolation structure 150 does not extend over and along a top of the substrate 102 between the first isolation segment 150a and the second isolation segment 150b. Instead, a top surface of the substrate isolation structure 150 is even with or about even with a top surface of the substrate 102.

Figure 4:
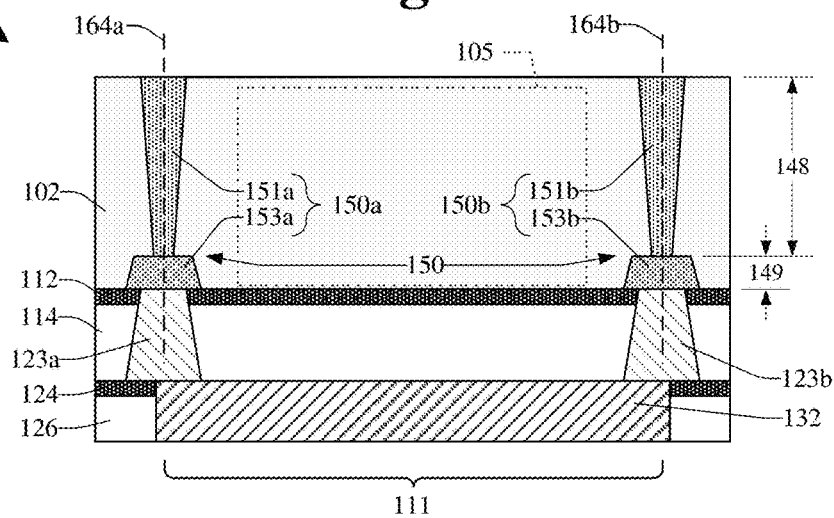

FIG. 4 illustrates a cross-sectional view 400 of some additional embodiments an image sensor in which substrate isolation structure 150 is divided into a DTI structure and an STI structure. The first isolation segment 150a and the second isolation segment 150b comprise a first DTI segment 151a and a second DTI segment 151b, respectively, that extend into an upper side of the substrate 102 to a first depth 148 and that define the DTI structure. Further, the first isolation segment 150a and the second isolation segment 150b comprise a first STI segment 153a and a second STI segment 153b, respectively, that extend into a lower side of the substrate 102 to a second depth 149 less than the first depth 148 and that define the STI structure.

The first STI segment 153a and the second STI segment 153b may be disposed directly below the first DTI segment 151a and the second DTI segment 151b, respectively. In addition, the first dummy segment 123a and the second dummy segment 123b may be disposed directly below the first STI segment 153a and the second STI segment 153b, respectively, such that the first DTI segment 151a, the first STI segment 153a, and the first dummy segment 123a are disposed along a first common vertical axis 164a and the second DTI segment 151b, the second STI segment 153b, and the second dummy segment 123b are disposed along a second common vertical axis 164b. Thus, the first STI segment 153a and the second STI segment 153b may vertically separate the first DTI segment 151a from the first dummy segment 123a and the second DTI segment 151b from the second dummy segment 123b, respectively. Further, the first DTI segment 151a may directly contact the first STI segment 153a and the first STI segment 153a may directly contact the first dummy segment 123a. In addition, the second DTI segment 151b may directly contact the second STI segment 153b and the second STI segment 153b may directly contact the second dummy segment 123b. In some embodiments, any of the DTI segments and the STI segments may, for example, comprise the one or more isolation materials.

Figure 5:
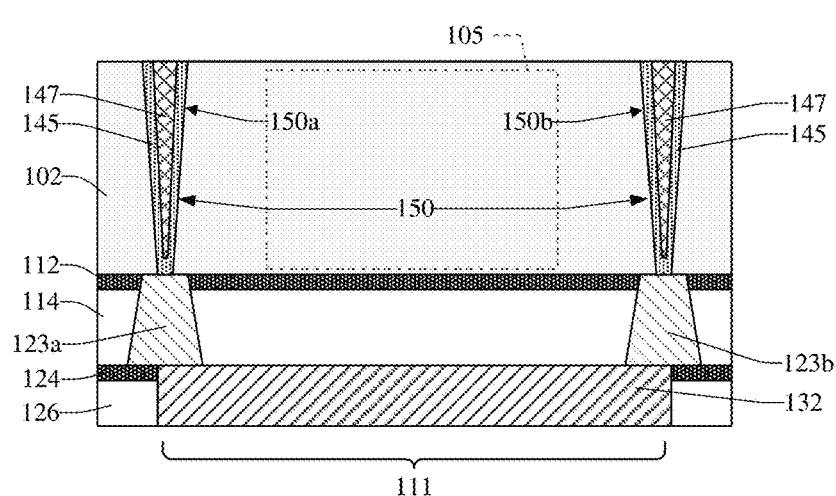

FIG. 5 illustrates a cross-sectional view 500 of some additional embodiments an image sensor in which the first isolation segment 150a and the second isolation segment 150b are defined by a first isolation layer 145 and a second isolation layer 147 that comprise different materials. For example, the first isolation layer 145 may be or comprise a dielectric and second isolation layer 147 may be or comprise a metal. The first isolation layer 145 may be disposed along outer sidewalls and a lower surface of the second isolation layer 147 such that the first isolation layers 145 surrounds the second isolation layer 147 and laterally separates the second isolation layer 147 from the substrate 102.

In some embodiments, the first isolation layer 145 may, for example, comprise hafnium oxide, aluminum oxide, a high k dielectric, another suitable dielectric material, or any combination of the foregoing. In addition, the second isolation layer 147 may, for example, comprise silicon dioxide, silicon nitride, tungsten, another suitable material, or any combination of the foregoing.

Figure 6:
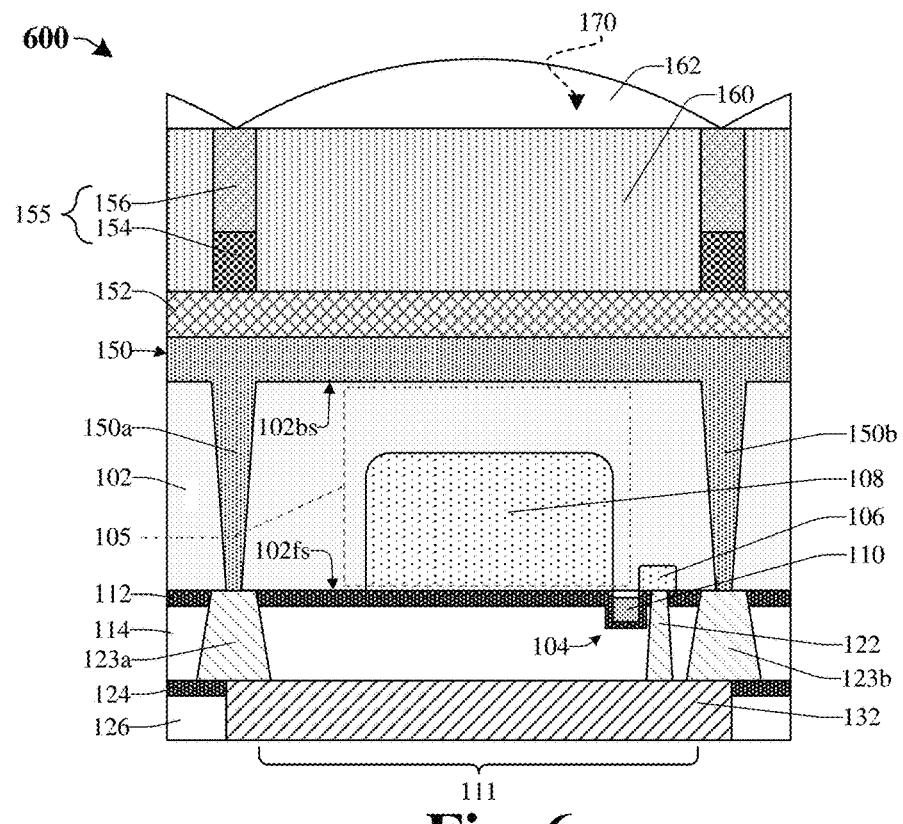
FIG. 6 illustrates a cross-sectional view of some embodiments of a back-side illuminated (BSI) image sensor including a pixel isolation structure, the pixel isolation structure comprising a dummy contact structure.

FIG. 6 illustrates a cross-sectional view 600 of some embodiments of a back-side illuminated (BSI) image sensor comprising a pixel isolation structure. The BSI image sensor comprises a photodetector 105 in a substrate 102 along a front side 102fs of the substrate 102. The photodetector may comprise a first doped semiconductor region 108 and a surrounding region of the substrate 102. The first doped semiconductor region 108 may form a p-n junction with the surrounding region of the substrate 102.

Further, a pixel transistor 104 comprising a gate 110 may be disposed along the front side 102fs of the substrate 102 and a floating diffusion (FD) region 106 may be disposed in the substrate 102 along the front side 102fs of the substrate. A first contact 122 may extend through a first dielectric layer 114 to a first metal line 132 and may electrically couple the pixel transistor 104 and/or the FD region 106 to the first metal line 132 or some other suitable metal line. A buffer layer 152 may be disposed on a back side 102bs of the substrate and may extend over the photodetector 105.

In addition, a color filter 160 may be disposed on the back side 102bs of the substrate 102 and over the photodetector 105. A composite metal grid (CMG) 155 may be disposed on the back side 102bs of the substrate 102 over the isolation segments (e.g., 150a, 150b) and the dummy segments (e.g., 123a, 123b) along a boundary of the pixel 111. The CMG 155 may comprise a metal grid layer 154 and a dielectric grid layer 156 over the metal grid layer 154. The color filter 160 may be disposed between sidewalls of the CMG 155. A micro-lens 162 may be disposed on the back side 102bs of the substrate 102 over the color filter 160 and thus over the photodetector 105. Photons 170 may enter the BSI image sensor through the micro-lens 162. Thus, the photons 170 may enter the substrate 102 through the back side 102bs of the substrate 102, thereby making the image sensor "backside illuminated".

In some embodiments, the pixel transistor 104 may, for example, comprise a transfer transistor, a source-follower transistor, a row select transistor, a reset transistor, some other pixel transistor, or another transistor.

In some embodiments, the FD region 106 and the first doped semiconductor region 108 may, for example, comprise doped silicon or the like.

In some embodiments, the first contact 122 may, for example, comprise tungsten, copper, titanium, another suitable metal, or any combination of the foregoing.

In some embodiments, the buffer layer 152 may, for example, comprise silicon dioxide, silicon nitride, another suitable dielectric, or any combination of the foregoing.

In some embodiments, the metal grid layer 154 may, for example, comprise tungsten, copper, another suitable metal, or any combination of the foregoing. In some embodiments, the dielectric grid layer 156 may, for example, comprise silicon dioxide, silicon nitride, another suitable dielectric, or any combination of the foregoing.

Figure 7:
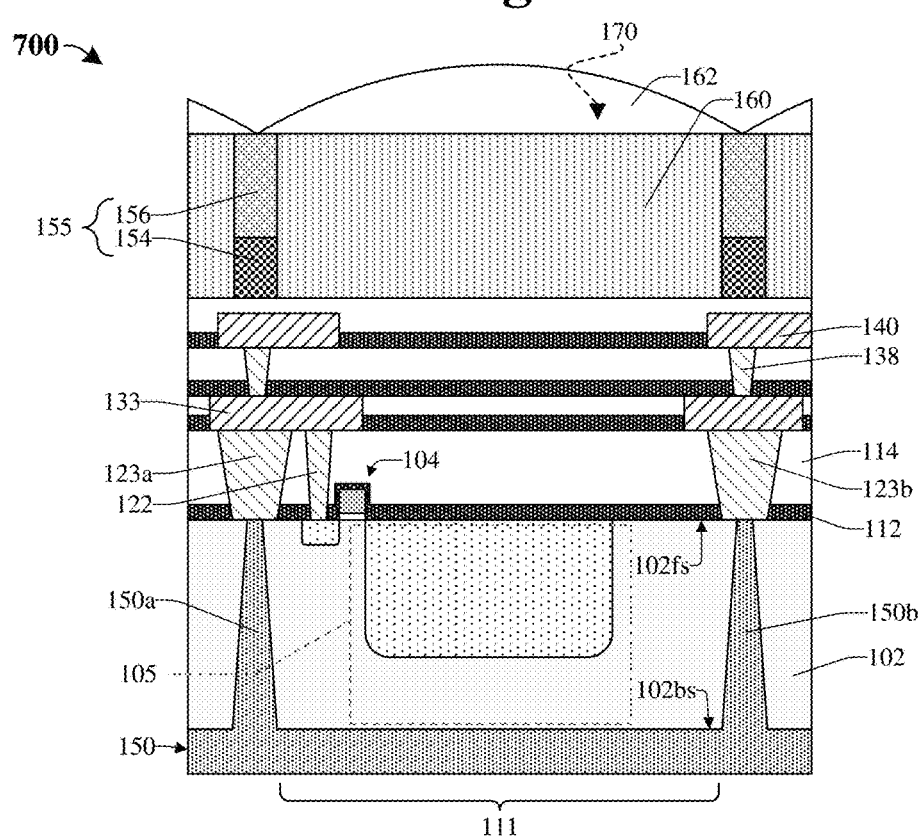
FIG. 7 illustrates a cross-sectional view of some embodiments of a front-side illuminated (FSI) image sensor including a pixel isolation structure, the pixel isolation structure comprising a dummy contact structure.

FIG. 7 illustrates a cross-sectional view 700 of some embodiments of a front-side illuminated (FSI) image sensor comprising a pixel isolation structure. The FSI image sensor comprises a photodetector 105 in a substrate 102 along a front side 102fs of the substrate 102. A first metal line 133 may not extend over the photodetector 105 or past a boundary of the photodetector 105 to allow radiation to pass to the photodetector 105 from the front side 102fs of the substrate 102. One or more additional metal lines and vias (e.g., 138, 140) may be formed over the first metal line 133 and may not extend over the photodetector 105 or past the boundary of the photodetector 105.

In addition, a color filter 160 may be disposed on the front side 102fs of the substrate 102 and over the photodetector 105. A CMG 155 may be disposed on the front side 102fs of the substrate 102 over the isolation segments (e.g., 150a, 150b) and the dummy segments (e.g., 123a, 123b) along a boundary of the pixel 111. The color filter 160 may be disposed between sidewalls of the CMG 155. A micro-lens 162 may be disposed on the front side 102fs of the substrate 102 over the color filter 160 and thus over the photodetector 105. Photons 170 may enter the FSI image sensor through the micro-lens 162. Thus, the photons 170 may enter the substrate 102 through the front side 102fs of the substrate 102, thereby making the image sensor "front-side illuminated".

Figure 8:
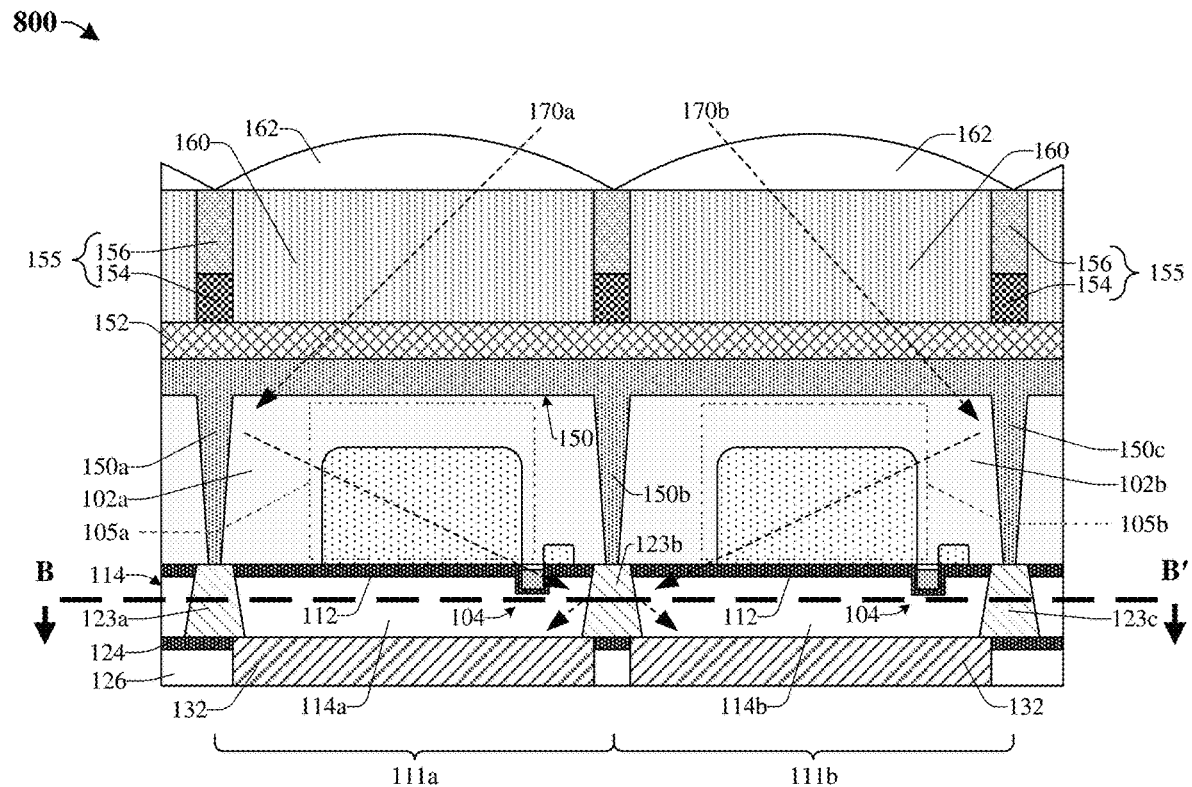
FIG. 8 illustrates a cross-sectional view of some additional embodiments of an image sensor comprising a plurality of pixels and a pixel isolation structure, the pixel isolation structure comprising a dummy contact structure.

FIG. 8 illustrates a cross-sectional view 800 of some additional embodiments of an image sensor comprising a plurality of pixels and a pixel isolation structure, the pixel isolation structure comprising a dummy contact structure 123. The cross-sectional view 800 may, for example, be taken across the line B-B' illustrated in FIG. 9. A first pixel 111a comprising a first photodetector 105a may be laterally adjacent to a second pixel 111b comprising a second photodetector 105b. A second isolation segment 150b may separate the substrate 102 along a boundary between the first pixel 111a and the second pixel 111b such that the substrate 102 comprises a first substrate region 102a and a separate second substrate region 102b. Further, a third isolation segment 150c may be disposed along a boundary of the second pixel 111b. In addition, a second dummy segment 123b may further separate the first pixel 111a from the second pixel 111b along the boundary between the pixels. Further, a third dummy segment 123c may be disposed along a boundary of the second pixel 111b.

Together, the second isolation segment 150b and the second dummy segment 123b may isolate the first pixel 111a from the second pixel 111b. As such, a first photon 170a that enters the first pixel 111a may not exit the first pixel 111a and enter the second pixel 111b. Further, a second photon 170b that enters the second pixel 111b may not exit the second pixel 111b and enter the first pixel 111a. As a result, crosstalk between the first pixel 111a and the second pixel 111b may be reduced, thereby improving the performance of the image sensor.

Figure 9:
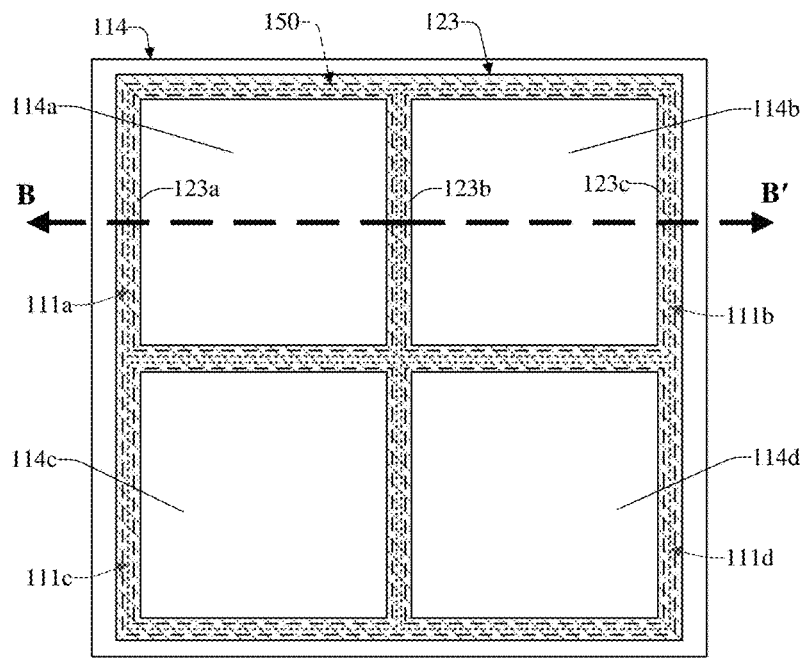
FIG. 9 illustrates an overhead view of some embodiments of the image sensor of FIG. 8.

FIG. 9 illustrates an overhead view 900 of some embodiments of the image sensor of FIG. 8. The image sensor may include a pixel array comprising a plurality of pixels. For example, a first pixel 111a, a second pixel 111b, a third pixel 111c, and a fourth pixel 111d may be disposed in a four by four array along the substrate 102. A substrate isolation structure 150 may laterally separate the first pixel 111a, the second pixel 111b, the third pixel 111c, and the fourth pixel 111d from one another along boundaries of the aforementioned pixels (i.e., the substrate isolation structure 150 may continuously and individually surround the first pixel 111a, the second pixel 111b, the third pixel 111c, and the fourth pixel 111d in a closed path along boundaries of the aforementioned pixels). As a result, the substrate 102 may be divided into four or more substrate regions (not shown) that are laterally separated from one another by the substrate isolation structure 150. Additionally, a dummy contact structure 123 may be disposed directly below the substrate isolation structure 150. As a result, the first dielectric layer 114 may be divided into four or more dielectric regions (e.g., 114a, 114b, 114c, 114d) that are laterally separated from one another by the dummy contact structure 123.

In some embodiments, the dummy contact structure 123 and the substrate isolation structure 150 extend laterally along a boundary of the first pixel 111a in a first closed path and along a boundary of the second pixel 111b in a second closed path. In such embodiments, the second closed path partially, but not fully, overlaps with the first closed path (e.g., between the first pixel 111a and the second pixel 111b).

FIGS. 10-29 illustrate cross-sectional views 1000-2900 of some embodiments of a method for forming a BSI image sensor including a pixel isolation structure, the pixel isolation structure comprising a dummy contact structure 123. Although FIGS. 10-29 are described in relation to a method, it will be appreciated that the structures disclosed in FIGS. 10-29 are not limited to such a method, but instead may stand alone as structures independent of the method.

Figure 10:
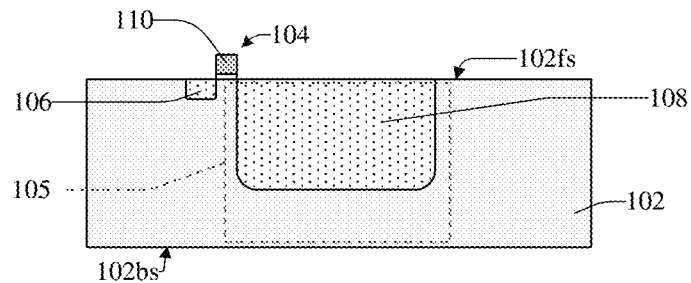
FIGS. 10-29 illustrate a series of cross-sectional views of some embodiments of a method for forming a BSI image sensor including a pixel isolation structure, the pixel isolation structure comprising a dummy contact structure.

As shown in cross-sectional view 1000 of FIG. 10, a photodetector 105 may be formed in a front side 102fs of a substrate 102. The photodetector 105 may comprise a first doped semiconductor region 108. A doping type of the first doped semiconductor region 108 may be opposite a doping type of the substrate 102 such that together, the two from a p-n junction (i.e., a photodiode). A floating diffusion (FD) region 106 may also be formed in the front side 102fs of the substrate 102. In addition, a pixel transistor 104 may be formed along the front side 102fs of the substrate 102. In some embodiments, the first doped semiconductor region 108 and the FD region 106 may be formed in the substrate 102 by ion implantation or another suitable process.

Figure 11:
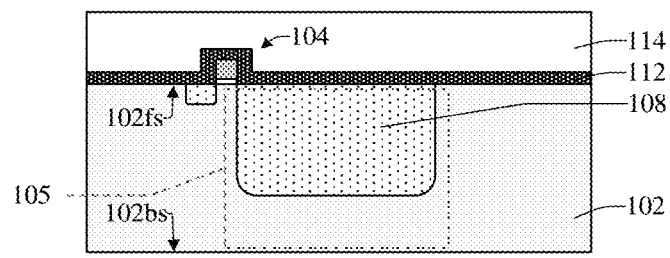

As shown in cross-sectional view 1100 of FIG. 11, a first etch stop layer 112 and a first dielectric layer 114 may be formed on the front side of the substrate such that the first etch stop layer 112 vertically separates the first dielectric layer 114 from the substrate 102. The first dielectric layer 114 may cover the pixel transistor 104. The first etch stop layer 112 and the first dielectric layer 114 may, for example, be formed by chemical vapor deposition (CVD), physical vapor deposition (PVD), atomic layer deposition (ALD), a spin-on process, another suitable deposition process, or any combination of the foregoing.

Figure 12:
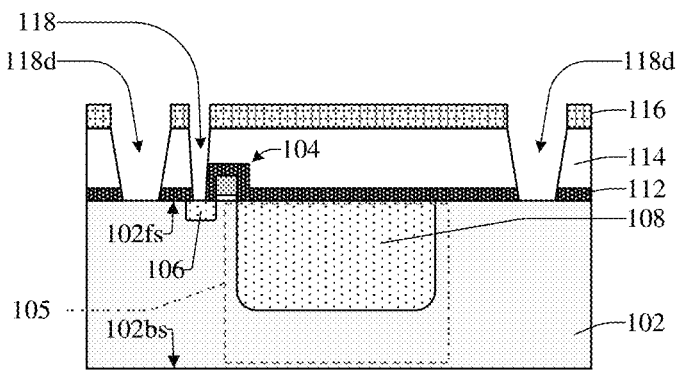

As shown in cross-sectional view 1200 of FIG. 12, a first photoresist mask 116 may be formed over the first dielectric layer 114. The first dielectric layer 114 and the first etch stop layer 112 may be patterned with the first photoresist mask 116 in place to form a plurality of contact openings in the first dielectric layer 114 and the first etch stop layer 112. For example, the plurality of contact openings may comprise a first contact opening 118 and a pair of dummy contact openings 118d. The pair of dummy contact openings 118d may uncover a portion of the front side 102fs of the substrate 102. The patterning may, for example, comprise a wet etch, a dry etch, or some other suitable etch.

In some embodiments, the first contact opening 118 may be formed over the FD region 106. In addition, the pair of dummy contact openings 118d may, for example, be formed on opposing sides of the photodetector 105. In some embodiments, the dummy contact openings 118d correspond to segments of a ring-shaped opening having the same layout as the dummy contact structure in FIG. 2. Other suitable top layouts are, however, amenable. The plurality of contact openings may extend through the first dielectric layer 114 and the first etch stop layer 112 to the front side 102fs of the substrate 102.

Figure 13:
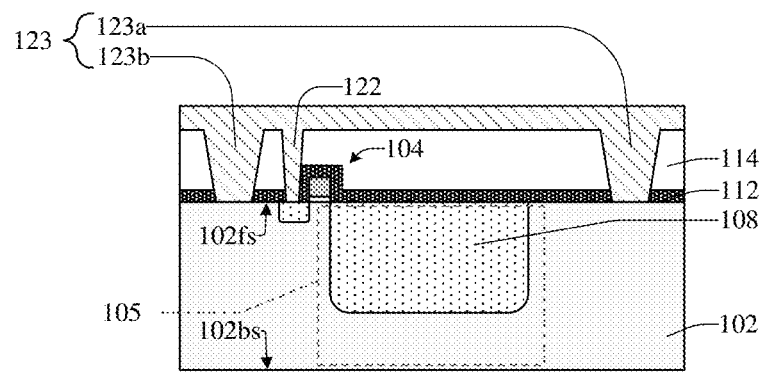

As shown in cross-sectional view 1300 of FIG. 13, a first contact 122 and a dummy contact structure 123 comprising a first dummy segment 123a and a second dummy segment 123b may be formed in the first contact opening 118 and the pair of dummy contact openings 118d, respectively, by depositing a first metal material in the aforementioned openings. The first metal material may overlie a top of the first dielectric layer 114 after it is deposited. Depositing the first metal material may, for example, comprise a sputtering process, an electroplating process, another suitable deposition process, or any combination of the foregoing.

Figure 14:
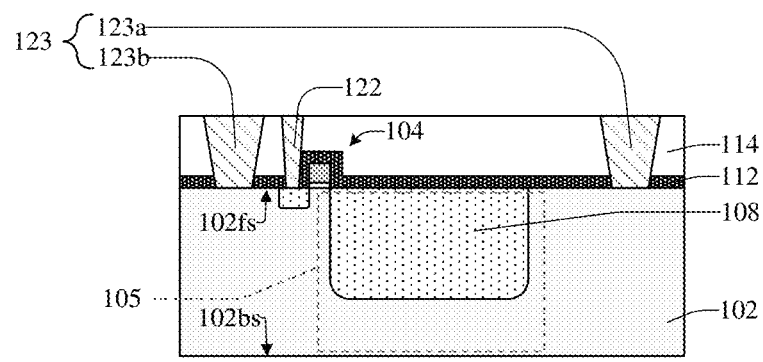

As shown in cross-sectional view 1400 of FIG. 14, a planarization process may be performed to remove the first metal material from the top of the first dielectric layer 114 such that tops of the first contact 122, the first dummy segment 123a, and the second dummy segment 123b are even with a top of the first dielectric layer 114. In some embodiments, the first and second dummy segments 123a, 123b correspond to segments of a ring-shaped dummy contact structure having the same layout as the dummy contact structure in FIG. 2. The planarization process may, for example, comprise a chemical mechanical polish (CMP) or some other suitable planarization process.

Figure 15:
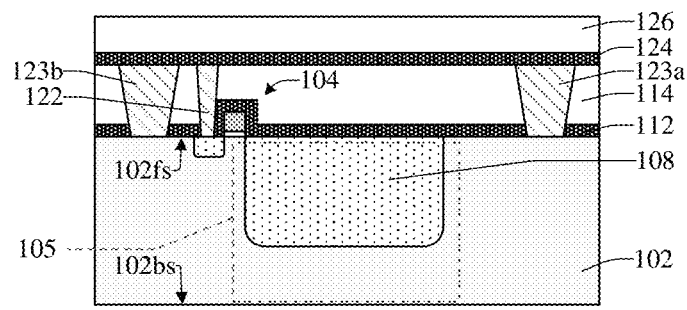

As shown in cross-sectional view 1500 of FIG. 15, a second etch stop layer 124 and a second dielectric layer 126 may be formed over the first dielectric layer 114 and over the tops of the first contact 122, the first dummy segment 123a, and the second dummy segment 123b. The second etch stop layer 124 and the second dielectric layer 126 may, for example, be formed by CVD, PVD, ALD, a spin-on process, another suitable deposition process, or any combination of the foregoing.

Figure 16:
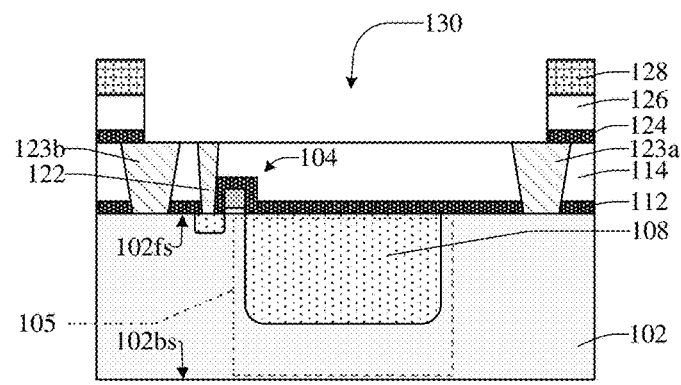

As shown in cross-sectional view 1600 of FIG. 16, a second photoresist mask 128 may be formed over the second dielectric layer 126. The second dielectric layer 126 and the second etch stop layer 124 may be patterned with the second photoresist mask 128 in place to form a first trench opening 130 in the second dielectric layer 126 and the second etch stop layer 124. The first trench opening 130 may extend over the photodetector 105 and may further extend from over a top of the first dummy segment 123a to over a top of the second dummy segment 123b (i.e., between the first dummy segment 123a and the second dummy segment 123b). The patterning may, for example, comprise a wet etch, a dry etch, or some other suitable etch.

Figure 17:
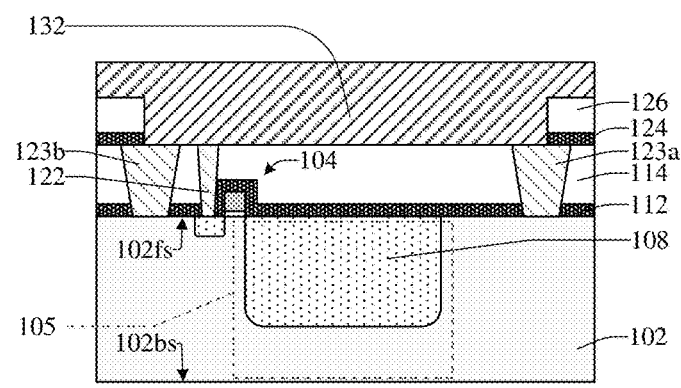

As shown in cross-sectional view 1700 of FIG. 17, a first metal line 132 may be formed in the first trench opening 130 by depositing a second metal material in the first trench opening 130. The second metal material may overlie a top the second dielectric layer 126 after it is deposited and may continuously extend from over a top of the first dummy segment 123a to over a top of the second dummy segment 123b. Depositing the second metal material may, for example, comprise a sputtering process, an electroplating process, another suitable deposition process, or any combination of the foregoing.

Figure 18:
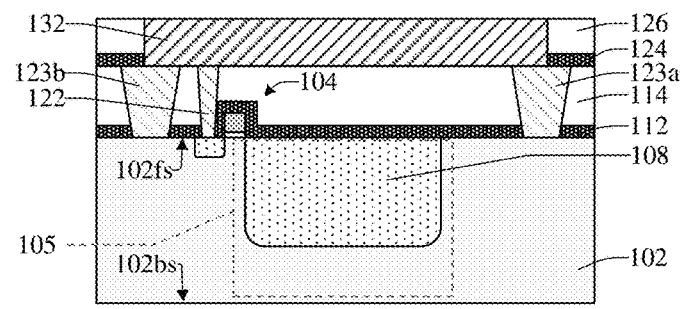

As shown in cross-sectional view 1800 of FIG. 18, a planarization process may be performed to remove the second metal material from the top of the second dielectric layer 126 such that top of the first metal line 132 may be even with a top of the second dielectric layer 126. The polishing or planarization process may, for example, comprise a CMP or some other suitable planarization process.

Figure 19:
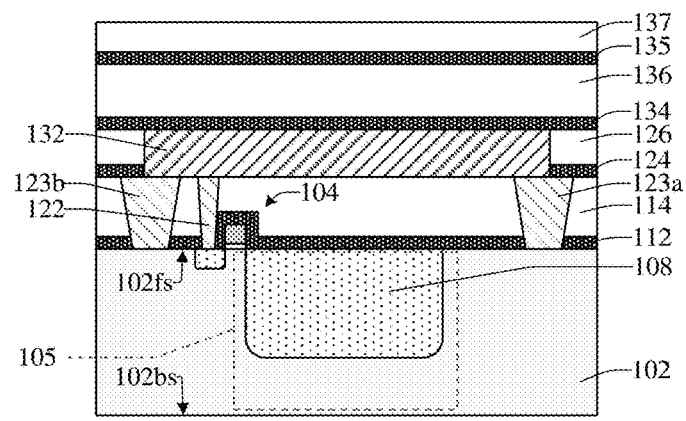

As shown in cross-sectional view 1900 of FIG. 19, one or more dielectric layers and a one or more etch stop layers may be formed over the first metal line 132. For example, a third etch stop layer 134 may be formed over the first metal line 132 and the second dielectric layer 126, a third dielectric layer 136 may be formed over the third etch stop layer 134, a fourth etch stop layer 135 may be formed over the third dielectric layer 136, and a fourth dielectric layer 137 may be formed over the fourth etch stop layer 135. Any of the aforementioned layers may, for example, be formed by CVD, PVD, ALD, a spin-on process, another suitable deposition process, or any combination of the foregoing.

Figure 20:
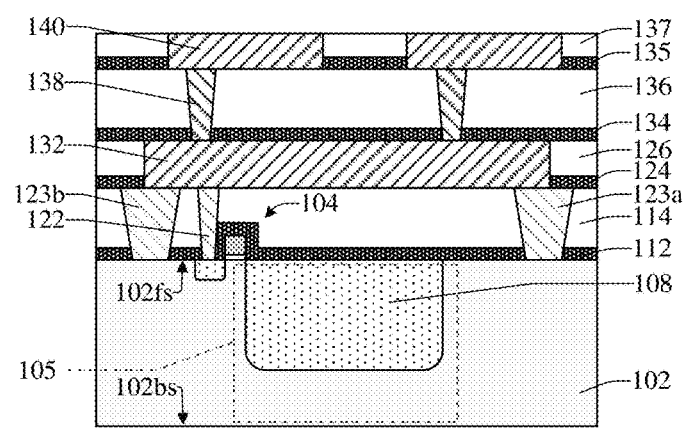

As shown in cross-sectional view 2000 of FIG. 20, one or more metal lines and one or more vias may be formed over the first metal line 132. For example, a first via 138 may be formed within the third dielectric layer 136 and over the first metal line 132. The first via 138 may directly contact the first metal line. In addition, a second metal line 140 may be formed in the fourth dielectric layer 137 and over the first via 138. The second metal line 140 may directly contact the first via. Any of the aforementioned metal lines and vias may, for example, be formed by sputtering, an electroplating process, another suitable deposition process, or any combination of the foregoing.

Figure 21:
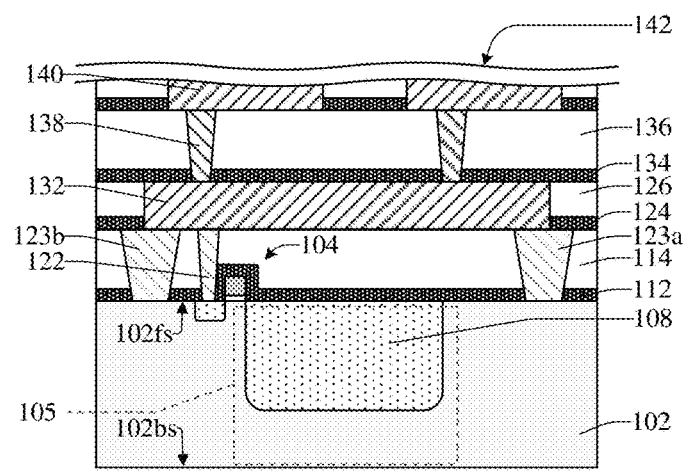

As shown in cross-sectional view 2100 of FIG. 21, additional interconnects 142 may be formed over the second metal line 140. The additional interconnects 142 may comprise additional metal lines and additional vias. The additional interconnects 142 may, for example, be formed by sputtering, an electroplating process, another suitable deposition process, or any combination of the foregoing.

Figure 22:
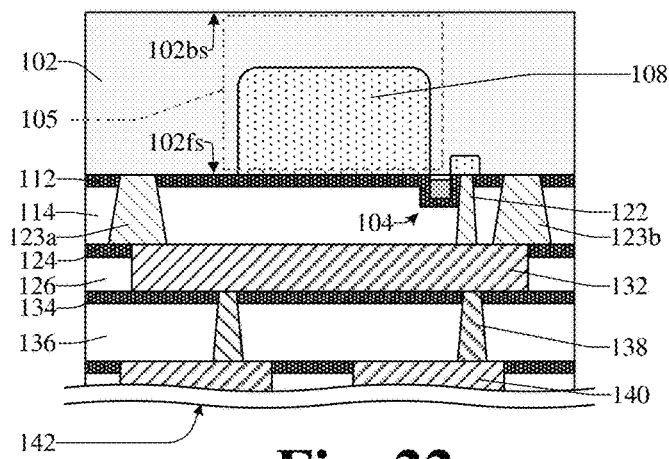

As shown in cross-sectional view 2200 of FIG. 22, the image sensor may be rotated such that a back side 102bs of the substrate 102 overlies the front side 102fs of the substrate 102.

Figure 23:
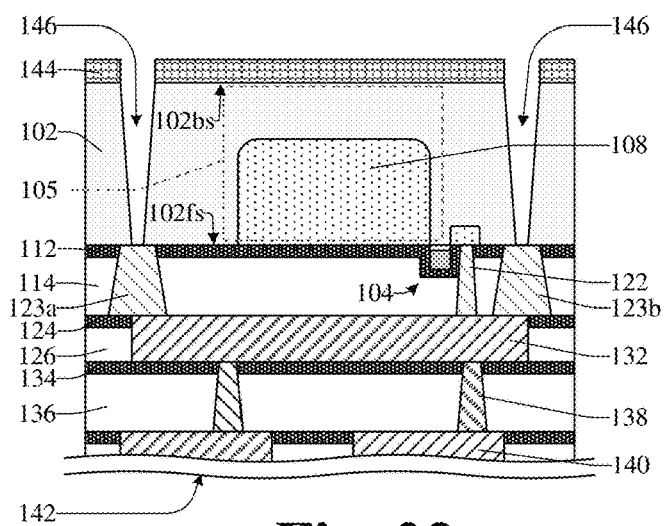

As shown in cross-sectional view 2300 of FIG. 23, a third photoresist mask 144 may be formed over the back side 102bs of the substrate 102. The back side 102bs of the substrate 102 may be patterned with the third photoresist mask 144 in place to form a pair of isolation openings 146 in the back side 102bs of the substrate 102. The pair of isolation openings 146 may extend through the substrate from the back side 102bs to the front side 102fs on opposing sides of the photodetector 105. Further, the pair of isolation openings 146 may be formed over the first dummy segment 123a and the second dummy segment 123b (i.e., the pair of isolation openings 146 may be respectively aligned with the first dummy segment 123a and the second dummy segment 123b). In some embodiments, the isolation openings 146 correspond to segments of a ring-shaped opening having the same layout as the substrate isolation structure in FIG. 2. Other suitable layouts are, however, amenable. The patterning may, for example, comprise a wet etch, a dry etch, or some other suitable etch.

Figure 24:
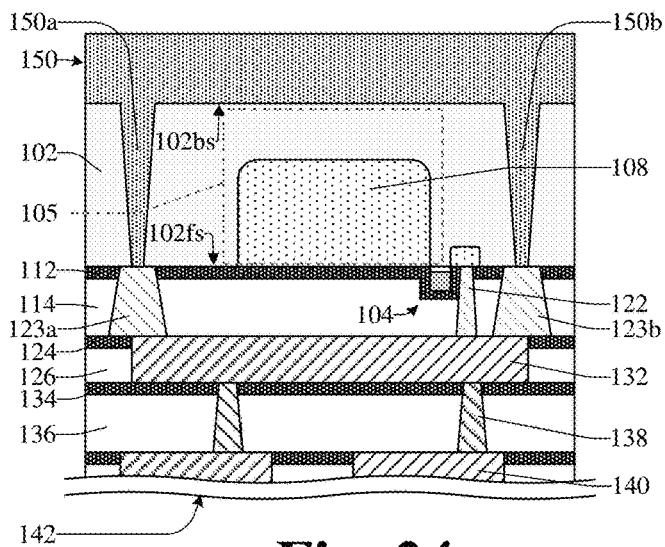

As shown in cross-sectional view 2400 of FIG. 24, a substrate isolation structure 150 may be formed over the back side 102bs of the substrate 102 and may be formed in the pair of isolation openings 146 to define a first isolation segment 150a and a second isolation segment 150b. In some embodiments, the substrate isolation structure 150 is ring shaped as in FIG. 2 and the first and second isolation segments 150a, 150b correspond to segments of the ring shape. Other suitable layouts are, however, amenable. The substrate isolation structure 150 may be formed by depositing a first isolation material over the back side 102bs of the substrate 102 and in the pair of isolation openings 146. Deposing the first isolation material may, for example, comprise CVD, PVD, ALD, a spin-on process, another suitable deposition process, or any combination of the foregoing. In addition, it will be appreciated that forming the substrate isolation structure 150 may further comprise depositing a second isolation material over the first isolation material such that the substrate isolation structure 150 comprises a first isolation layer 145 and a second isolation layer 147 surrounded by the first isolation layer 145, as seen in FIG. 5.

Figure 25:
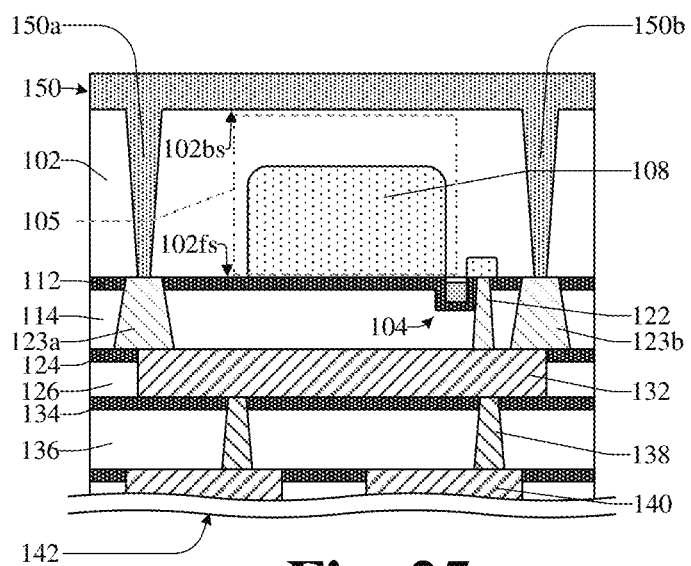

As shown in cross-sectional view 2500 of FIG. 25, a planarization process may be performed to reduce a thickness of the substrate isolation structure 150. The substrate isolation structure 150 may extend over the photodetector 105 after the planarization process (i.e., the substrate isolation structure 150 may cover the back side 102bs of the substrate 102 after the planarization process), as illustrated in FIG. 25. However, it will be appreciated that in some alternative embodiments, the substrate isolation structure 150 may not extend over the photodetector 105 after the polishing or planarization process (i.e., the substrate isolation structure 150 may not cover the back side 102bs of the substrate 102 after the polishing or planarization process). The planarization process may, for example, comprise a CMP or some other suitable planarization process.

Figure 26:
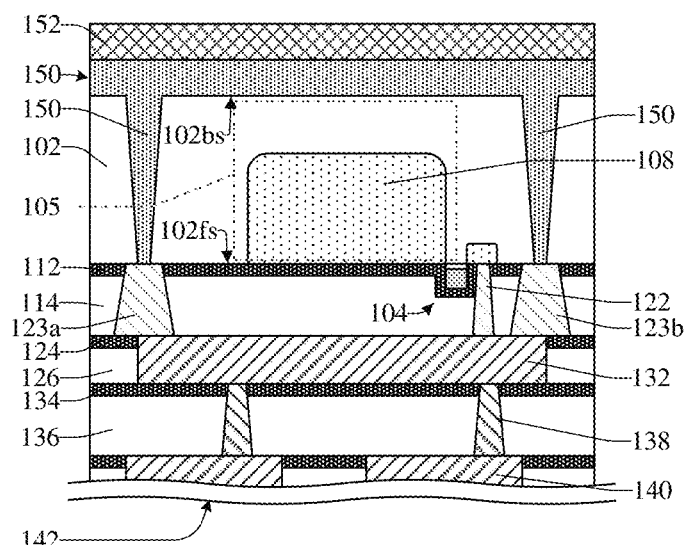

As shown in cross-sectional view 2600 of FIG. 26, a buffer layer 152 may be formed over the back side 102bs of the substrate 102 and over a top of the substrate isolation structure 150. The buffer layer 152 may, for example, be formed by CVD, PVD, ALD, a spin-on process, another suitable deposition process, or any combination of the foregoing.

Figure 27:
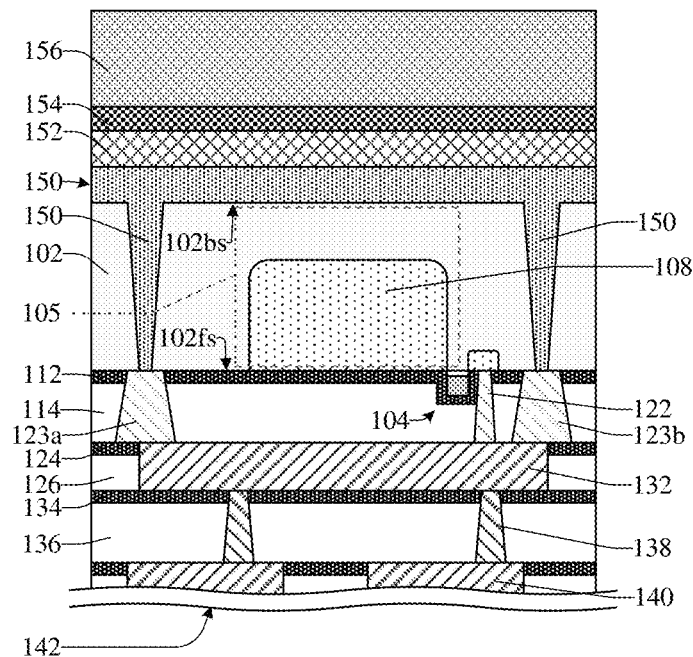

As shown in cross-sectional view 2700 of FIG. 27, a metal grid layer 154 may be formed over the buffer layer 152 and a dielectric grid layer 156 may be formed over the metal grid layer 154. The metal grid layer 154 may, for example, be formed by depositing a metal material over the buffer layer 152 with a sputtering process, an electroplating process, another suitable deposition process, or any combination of the foregoing. The dielectric grid layer 156 may, for example, be formed over the metal grid layer 154 by CVD, PVD, ALD, a spin-on process, another suitable deposition process, or any combination of the foregoing.

Figure 28:
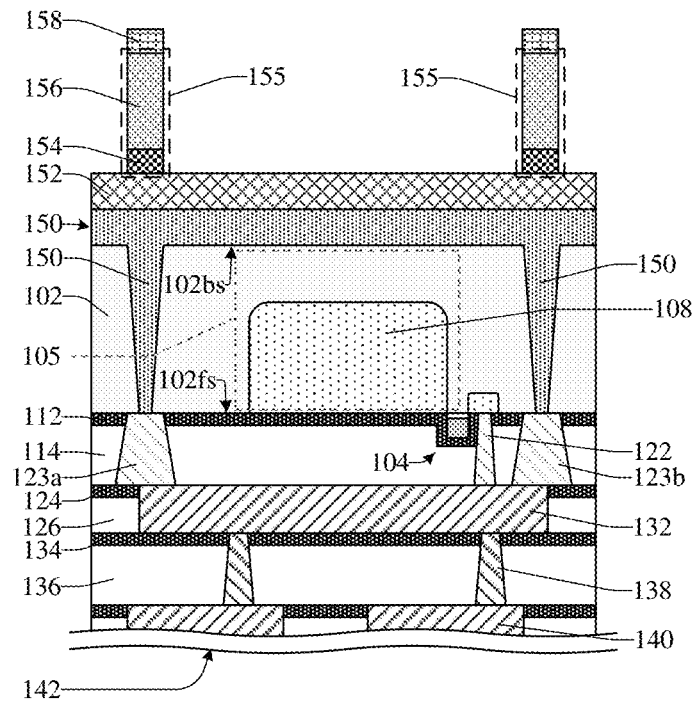

As shown in cross-sectional view 2800 of FIG. 28, a fourth photoresist mask 158 may be formed over the dielectric grid layer 156. The dielectric grid layer 156 and the metal grid layer 154 may be patterned with the fourth photoresist mask 158 in place to form a CMG 155 over the back side 102bs of the substrate 102. The CMG may be formed directly over the first isolation segment 150a and the second isolation segment 150b. The patterning may, for example, comprise a wet etch, a dry etch, or some other suitable etch.

Figure 29:
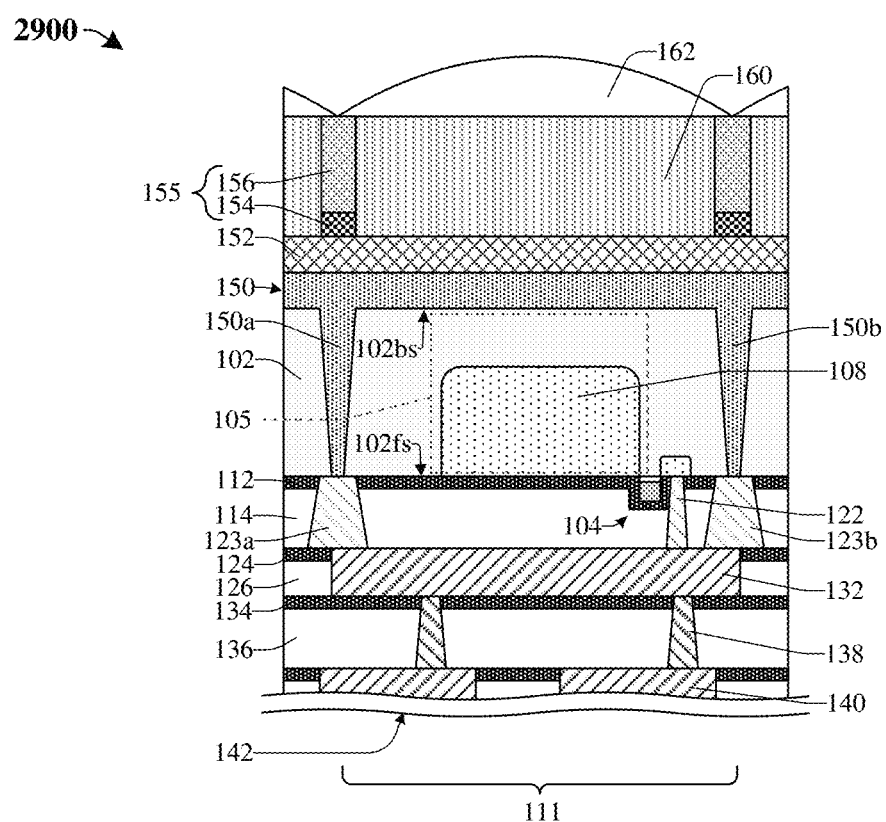

As shown in cross-sectional view 2900 of FIG. 29, one or more color filters may be formed over the over the buffer layer 152 and laterally adjacent to the CMG 155. In addition, one or more micro-lenses may be formed over the one or more color filters, respectively. For example, a color filter 160 may be formed over the buffer layer 152 and between the CMG 155 and a micro-lens 162 may be formed directly over the color filter.

By forming the dummy contact structure 123 in the first dielectric layer 114 along a boundary of the pixel 111, a first region of the first dielectric layer 114 may be isolated from neighboring regions of the first dielectric layer 114 corresponding to neighboring pixels. Further, by forming the substrate isolation structure 150 directly over the dummy contact structure 123, a first region of the substrate 102 may also be isolated from neighboring regions of the substrate 102 corresponding to neighboring pixels. Furthermore, by forming the first metal such that the first metal line extends continuously between the first dummy segment 123a and the second dummy segment, the pixel 111 may be further isolated from neighboring pixels at the interconnect level. Thus, the likelihood of a photon exiting the pixel 111 and entering a neighboring pixel at the first dielectric layer 114 and/or at the substrate 102 may be reduced. As a result, the performance of the image sensor may be increased.

Figure 30:
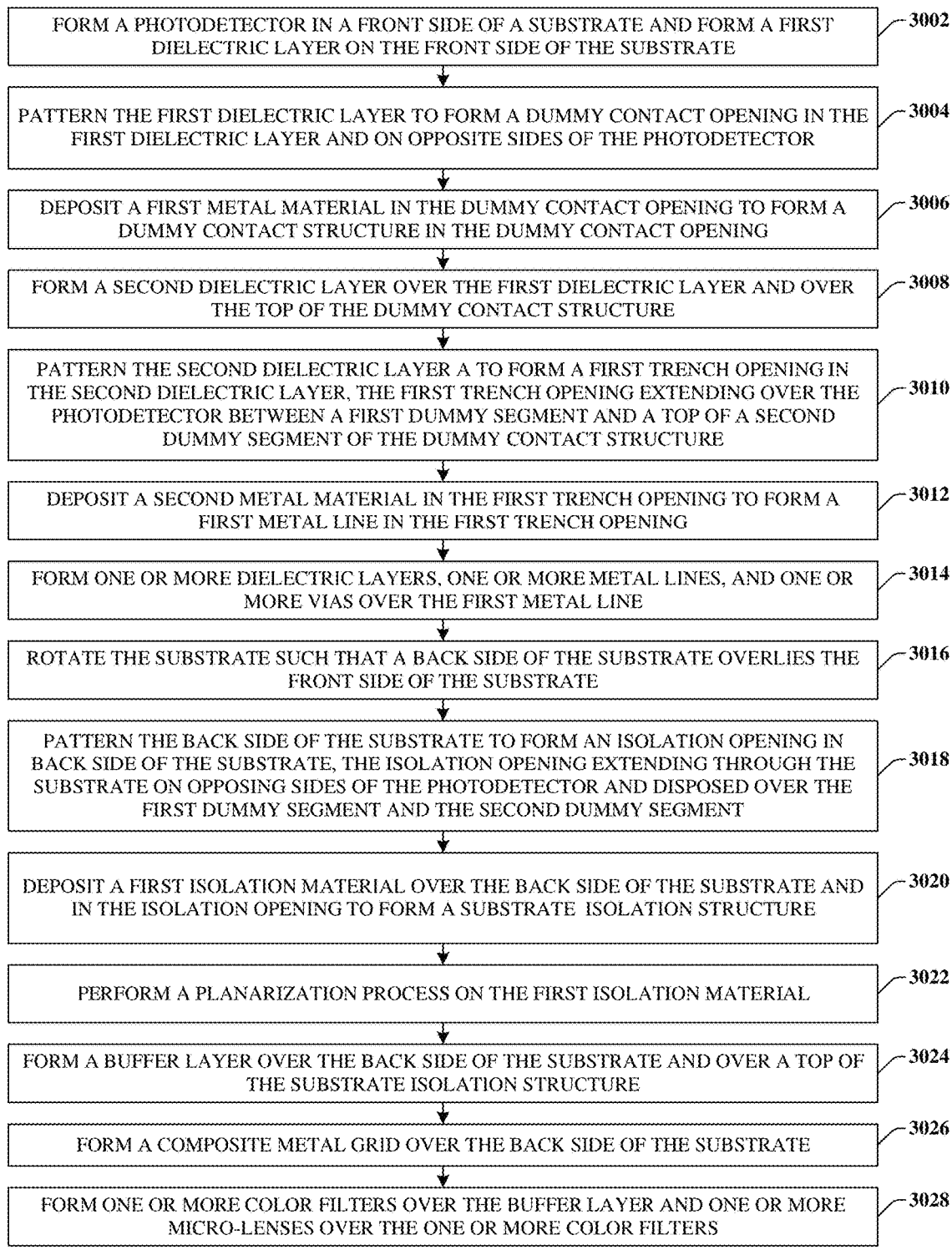
FIG. 30 illustrates a flow diagram of some embodiments of a method for forming a BSI image sensor including a pixel isolation structure, the pixel isolation structure comprising a dummy contact structure.

FIG. 30 illustrates a flow diagram of some embodiments of a method 3000 for forming a BSI image sensor including a pixel isolation structure, the pixel isolation structure comprising a dummy contact structure.

While method 3000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 3002, a photodetector may be formed in a front side of a substrate and a first dielectric layer may be formed on the front side of the substrate. FIGS. 10 and 11 illustrate cross-sectional views 1000 and 1100 of some embodiments corresponding to act 3002.

At 3004, the first dielectric layer may then be patterned to form a dummy contact opening in the first dielectric layer and on opposite sides of the photodetector. FIG. 12 illustrates a cross-sectional view 1200 of some embodiments corresponding to act 3004.

At 3006, a first metal material may be deposited in the dummy contact opening to form a dummy contact structure in the of dummy contact opening. FIG. 13 illustrates a cross-sectional view 1300 of some embodiments corresponding to act 3006.

At 3008, a second dielectric layer may be formed over the first dielectric layer and over the top of the dummy contact structure. FIG. 15 illustrates a cross-sectional view 1500 of some embodiments corresponding to act 3008.

At 3010, the second dielectric layer may be patterned to form a first trench opening in the second dielectric layer. The first trench opening may extend over the photodetector and may further extend from over a top of a first dummy segment and a top of a second dummy segment of the dummy contact structure. FIG. 16 illustrates a cross-sectional view 1600 of some embodiments corresponding to act 3010.

At 3012, a second metal material may be deposited in the first trench opening to form a first metal line in the first trench opening. FIG. 17 illustrates a cross-sectional view 1700 of some embodiments corresponding to act 3012.

At 3014, one or more dielectric layers, one or more metal lines, and one or more vias may be formed over the first metal line. FIGS. 19 and 20 illustrate cross-sectional views 1900 and 2000 of some embodiments corresponding to act 3014.

At 3016, the substrate may be rotated such that a back side of the substrate overlies the front side of the substrate. FIG. 22 illustrates a cross-sectional view 2200 of some embodiments corresponding to act 3016.

At 3018, the back side of the substrate may be patterned to form an isolation opening in back side of the substrate. The isolation opening may extend through the substrate from the back side to the front side on opposing sides of the photodetector. Further, the isolation opening may be formed over the first dummy segment and the second dummy segment. FIG. 23 illustrates a cross-sectional view 2300 of some embodiments corresponding to act 3018.

At 3020, a first isolation material may be deposited over the back side of the substrate and in the isolation opening to form a substrate isolation structure. FIG. 24 illustrates a cross-sectional view 2400 of some embodiments corresponding to act 3020.

At 3022, a planarization process may be performed on the first isolation material. FIG. 25 illustrates a cross-sectional view 2500 of some embodiments corresponding to act 3022.

At 3024, a buffer layer may be formed over the back side of the substrate and over a top of the substrate isolation structure. FIG. 26 illustrates a cross-sectional view 2600 of some embodiments corresponding to act 3024.

At 3026, a composite metal grid may be formed over the back side of the substrate. FIGS. 27 and 28 illustrate cross-sectional views 2700 and 2800 of some embodiments corresponding to act 3026.

At 3028, one or more color filters may be formed over the over the buffer layer and laterally adjacent to the CMG. In addition, one or more micro-lenses may be formed over the one or more color filters, respectively. FIG. 29 illustrates a cross-sectional view 2900 of some embodiments corresponding to act 3028.

FIGS. 31-44 illustrate cross-sectional views 3100-4400 of some embodiments of a method for forming an FSI image sensor including a pixel isolation structure, the pixel isolation structure comprising a dummy contact structure 123. Although FIGS. 31-44 are described in relation to a method, it will be appreciated that the structures disclosed in FIGS. 31-44 are not limited to such a method, but instead may stand alone as structures independent of the method.

Figure 36:
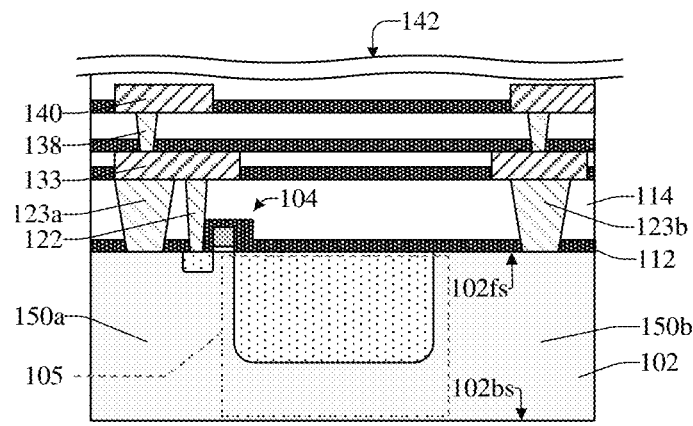

FIGS. 31-40 illustrate a similar process as that which is illustrated in FIGS. 10-25. However, in the method for forming the FSI image sensor, metal lines may be restricted to sides of the photodetector 105 so as not to block the photodetector 105 from receiving radiation from the front side 102fs of the substrate 102. As such, one or more metal lines (e.g., 133, 140, etc.) may not be formed over the photodetector 105 and thus a first metal line 133 may not extend from a top of the first dummy segment 123a to a top of the second dummy segment 123b, as seen in FIG. 36.

Figure 41:
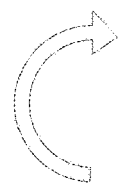
Figure 41:
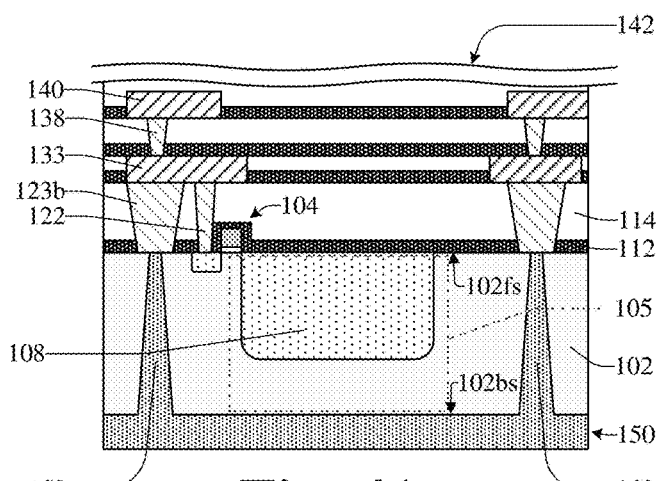

As shown in cross-sectional view 4100 of FIG. 41, the image sensor may be rotated again such that a front side 102fs of the substrate 102 overlies a back side 102bs of the substrate 102.

Figure 42:
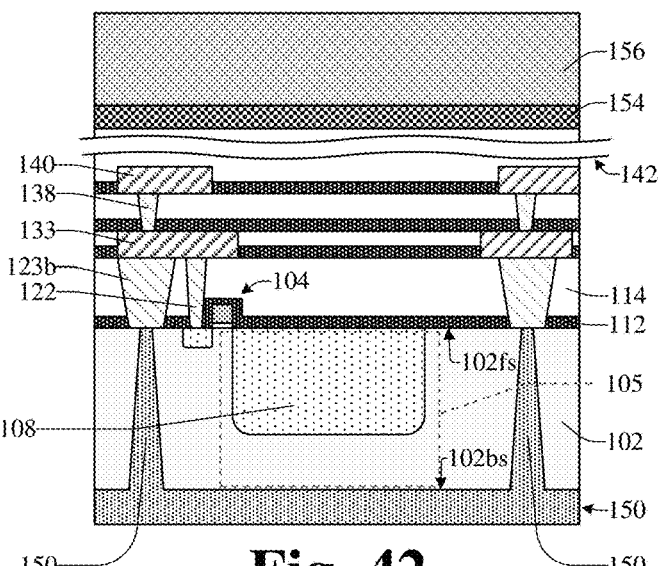

As shown in cross-sectional view 4200 of FIG. 42, a metal grid layer 154 may be formed over the front side 102fs of the substrate 102 and a dielectric grid layer 156 may be formed over the metal grid layer 154. The metal grid layer 154 may be formed by depositing a metal material over the buffer layer 152 by sputtering, electroplating, another suitable deposition process, or any combination of the foregoing. The dielectric grid layer 156 may, for example, be formed by depositing a dielectric material over the metal material by CVD, PVD, ALD, a spin-on process, another suitable deposition process, or any combination of the foregoing.

Figure 43:
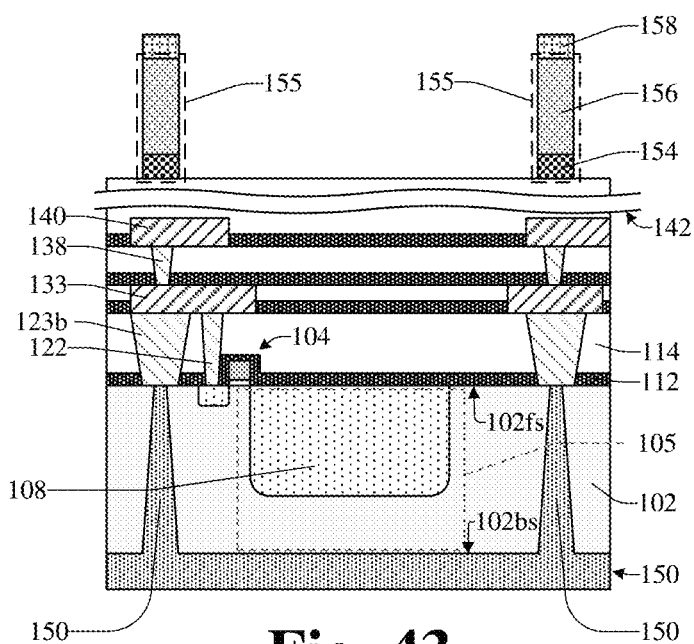

As shown in cross-sectional view 4300 of FIG. 43, a fourth photoresist mask 158 may be formed over the dielectric grid layer 156. The dielectric grid layer 156 and the metal grid layer 154 may be patterned with the fourth photoresist mask 158 in place to form a CMG 155 over the front side 102fs of the substrate 102. The patterning may, for example, comprise a wet etch, a dry etch, or some other suitable etch.

Figure 44:
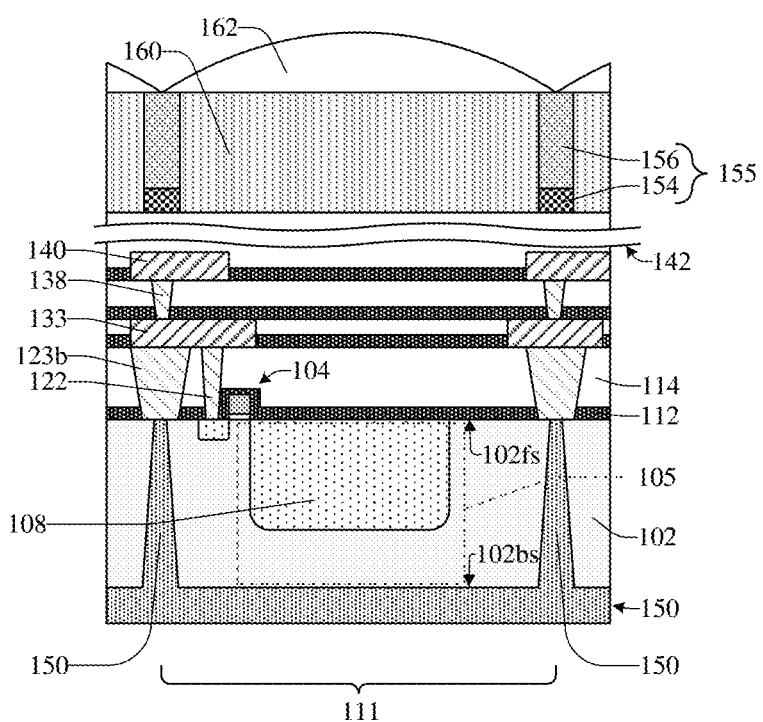

As shown in cross-sectional view 4400 of FIG. 44, one or more color filters may be formed over the over the front side 102fs of the substrate 102 and adjacent to the CMG 155. In addition, one or more micro-lenses may be formed over the one or more color filters, respectively. For example, a color filter 160 may be formed over the front side 102fs of the substrate 102 and between the CMG 155 and a micro-lens 162 may be formed directly over the color filter.

Again, by forming the dummy contact structure 123 in the first dielectric layer 114 along a boundary of the pixel and by forming the substrate isolation structure 150 directly over the dummy contact structure 123, the pixel 111 may be isolated from neighboring pixels. Thus, the likelihood of a photon exiting the pixel 111 and entering a neighboring pixel at the first dielectric layer 114 and/or at the substrate 102 may be reduced. As a result, the performance of the image sensor may be increased.

Figure 45:
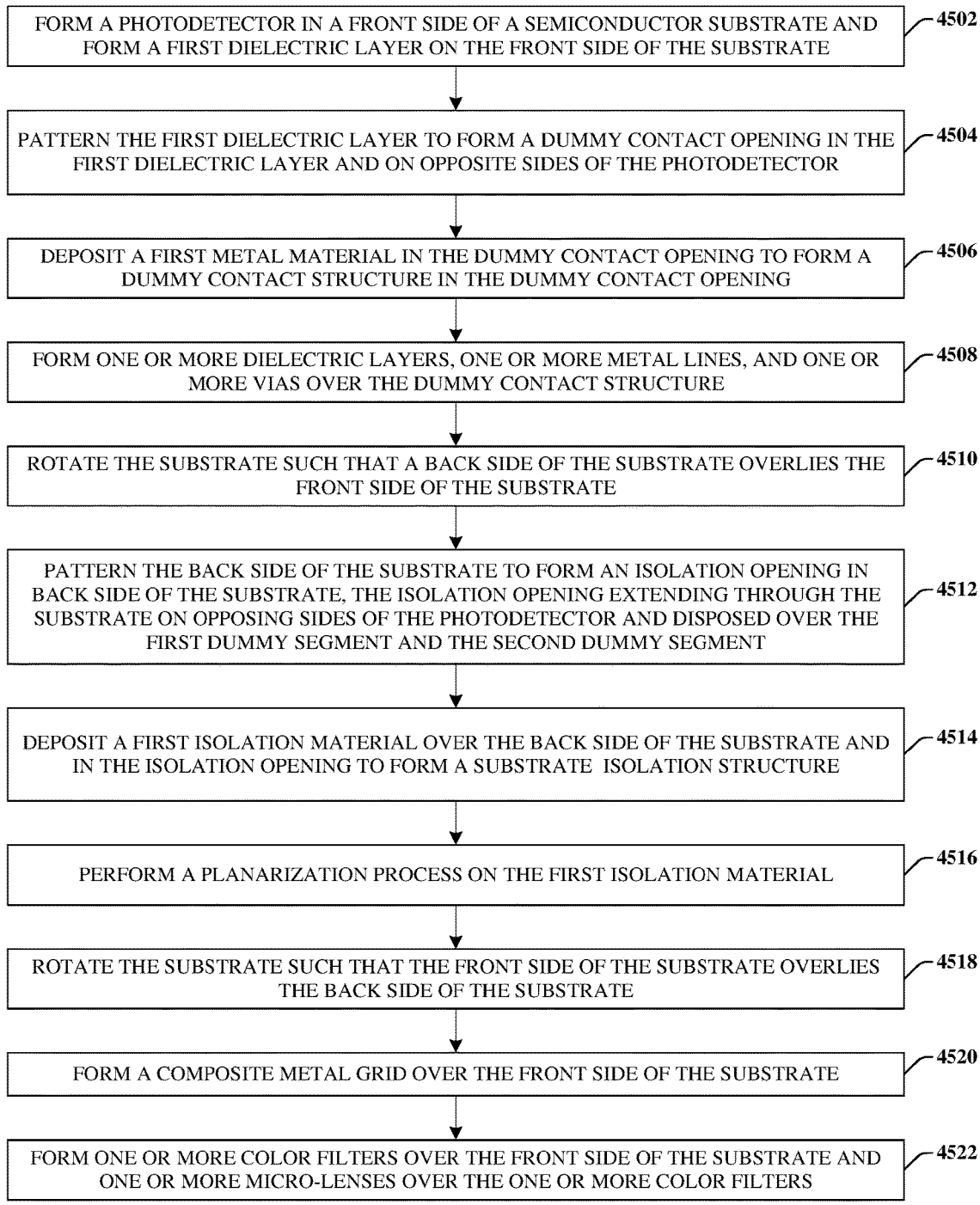
FIG. 45 illustrates a flow diagram of some embodiments of a method for forming an FSI image sensor including a pixel isolation structure, the pixel isolation structure comprising a dummy contact structure.

FIG. 45 illustrates a flow diagram of some embodiments of a method 4500 for forming an FSI image sensor including a pixel isolation structure, the pixel isolation structure comprising a dummy contact structure.

While method 4500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 31:
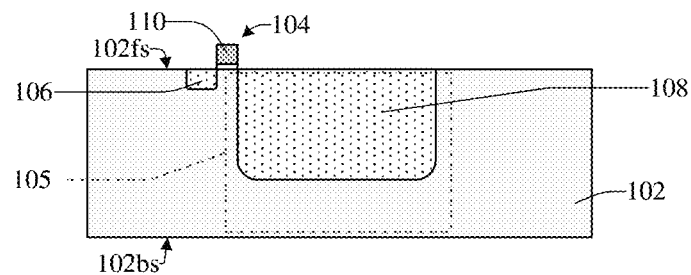
FIGS. 31-44 illustrate a series of cross-sectional views of some embodiments of a method for forming FSI an image sensor including a pixel isolation structure, the pixel isolation structure comprising a dummy contact structure.
Figure 32:
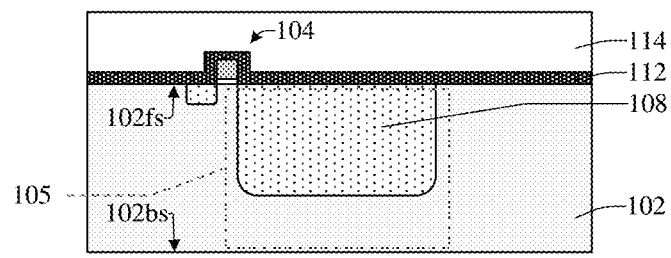

At 4502, a photodetector may be formed in a front side of a substrate and a first dielectric layer may be formed on the front side of the substrate. FIGS. 31 and 32 illustrate cross-sectional views 3100 and 3200 of some embodiments corresponding to act 4502.

Figure 33:
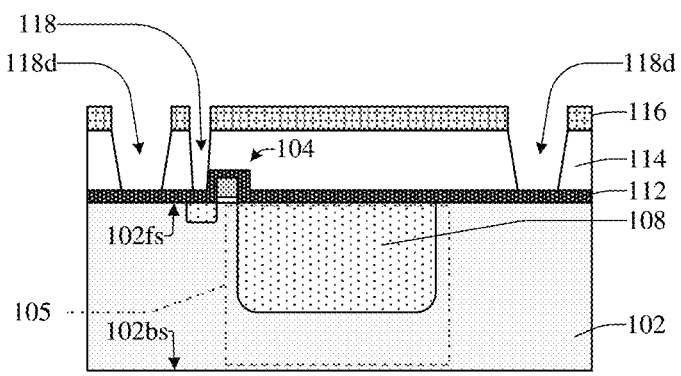

At 4504, the first dielectric layer may then be patterned to form a dummy contact opening in the first dielectric layer and on opposite sides of the photodetector. FIG. 33 illustrates a cross-sectional view 3300 of some embodiments corresponding to act 4504.

Figure 34:
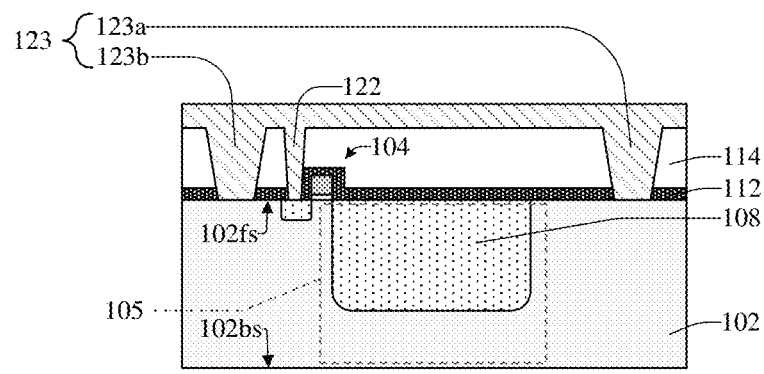
Figure 35:
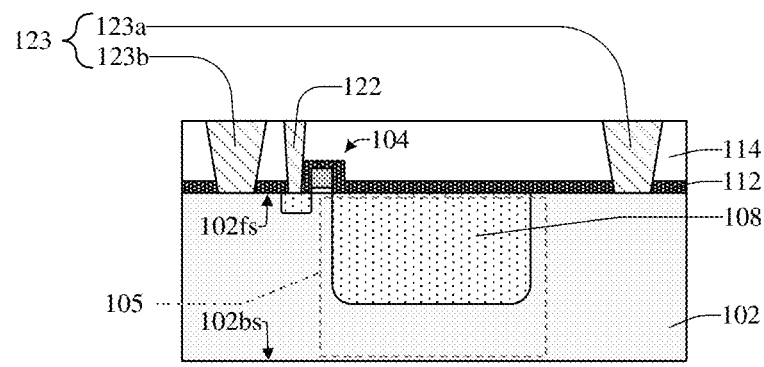

At 4506, a first metal material may be deposited in the dummy contact opening to form a dummy contact structure in the dummy contact opening. FIG. 34 illustrates a cross-sectional view 3400 of some embodiments corresponding to act 4506.

At 4508, one or more dielectric layers, one or more metal lines, and one or more vias may be formed over the dummy contact structure. FIG. 36 illustrates a cross-sectional view 3600 of some embodiments corresponding to act 4508.

Figure 37:
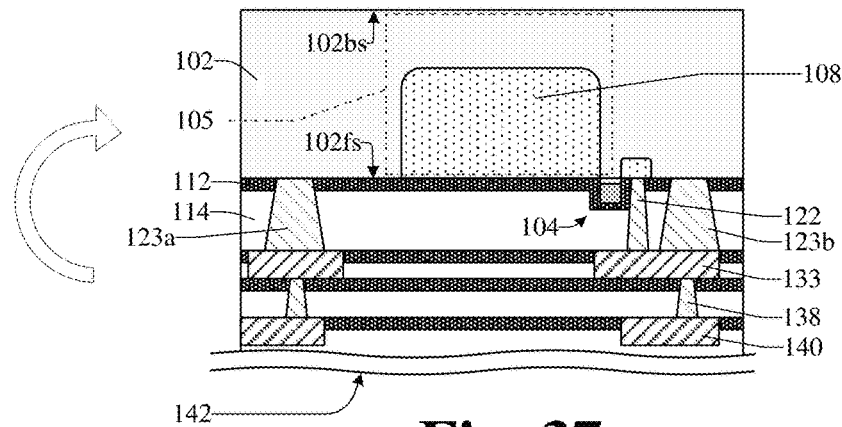

At 4510, the substrate may be rotated such that a back side of the substrate overlies the front side of the substrate. FIG. 37 illustrates a cross-sectional view 3700 of some embodiments corresponding to act 4510.

Figure 38:
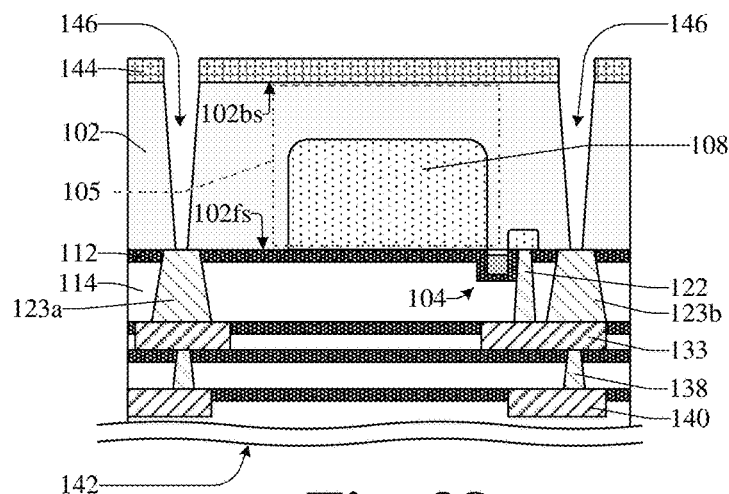

At 4512, the back side of the substrate may be patterned to form an isolation opening in back side of the substrate. The isolation opening may extend through the substrate from the back side to the front side on opposing sides of the photodetector. Further, the isolation opening may be formed over the first dummy segment and the second dummy segment. FIG. 38 illustrates a cross-sectional view 3800 of some embodiments corresponding to act 4512.

Figure 39:
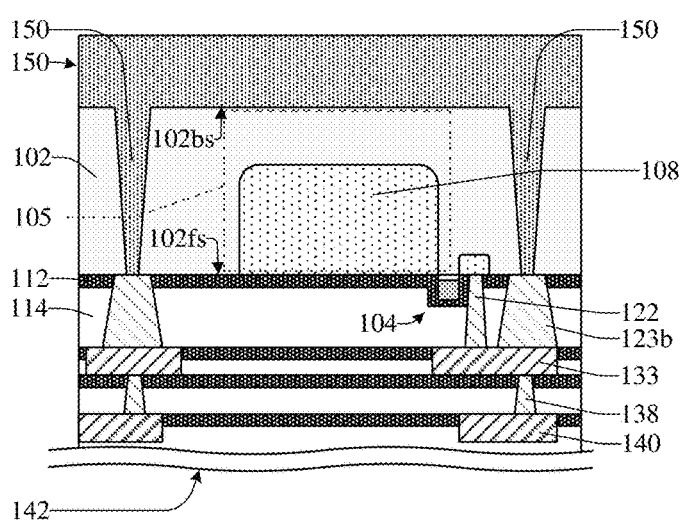

At 4514, a first isolation material may be deposited over the back side of the substrate and in the isolation opening to form a substrate isolation structure. FIG. 39 illustrates a cross-sectional view 3900 of some embodiments corresponding to act 4514.

Figure 40:
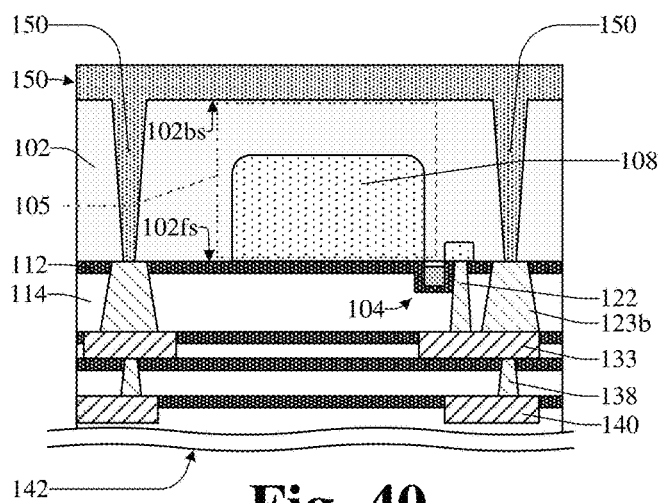

At 4516, a planarization process may be performed on the first isolation material. FIG. 40 illustrates a cross-sectional view 4000 of some embodiments corresponding to act 4516.

At 4518, the substrate may be rotated again such that the front side of the substrate overlies the back side of the substrate. FIG. 41 illustrates a cross-sectional view 4100 of some embodiments corresponding to act 4518.

At 4520, a composite metal grid may be formed over the front side of the substrate. FIGS. 42 and 43 illustrate cross-sectional views 4200 and 4300 of some embodiments corresponding to act 4520.

At 4522, one or more color filters may be formed over the over the front side of the substrate and laterally adjacent to the CMG. In addition, one or more micro-lenses may be formed over the one or more color filters, respectively. FIG. 44 illustrates a cross-sectional view 4400 of some embodiments corresponding to act 4522.

Thus, the present disclosure relates to an image sensor including a pixel isolation structure, the pixel isolation structure comprising a dummy contact structure for improving pixel isolation to reduce crosstalk between pixels, and a method for forming the image sensor.

Accordingly, in some embodiments, the present disclosure relates to an image sensor structure. The image sensor structure comprises a substrate. The substrate comprises a first side and a second side opposite the first side. A photodetector extends into the first side of the substrate. An isolation structure comprises a first isolation segment and a second isolation segment that extend through the substrate. The first isolation segment and the second isolation segment are respectively on opposite sides of the photodetector and comprise a dielectric. A first metal line is on the first side of the substrate. A dummy contact structure comprises a first dummy segment and a second dummy segment. Both the first dummy segment and the second dummy segment comprise metal and extend from the first metal line to the first isolation segment and the second isolation segment, respectively.

In other embodiments, the present disclosure relates to an image sensor structure. The image sensor structure comprises a substrate. The substrate comprises an upper surface and a lower surface. A pixel comprises a photodetector along the lower surface of the substrate. A substrate isolation structure comprises a first dielectric material. The substrate isolation structure extends vertically through the substrate from the upper surface of the substrate to the lower surface of the substrate. The substrate isolation structure extends laterally along a boundary of the pixel in a first closed path. A metal reflector underlies the photodetector. A dummy contact structure comprising a first metal material extends from the metal reflector to the substrate isolation structure. The dummy contact structure also extends laterally along the boundary of the pixel in the first closed path.

In yet other embodiments, the present disclosure relates to a method for forming an image sensor structure. The method comprises forming a photodetector in a first side of a substrate and forming a first dielectric layer on the first side of the substrate. The first dielectric layer is patterned to form a first opening having a pair of first opening segments that uncover the first side of the substrate. The first opening segments border the photodetector respectively on opposite sides of the photodetector. A dummy contact structure is formed in the first opening and comprises a first dummy segment and a second dummy segment respectively in the first opening segments. A metal reflector is formed directly contacting the first dummy segment and the second dummy segment on the first side of the substrate. A second side of the substrate opposite the first side is patterned to form a second opening having a pair of second opening segments that are aligned to the first dummy segment and the second dummy segment, respectively. A substrate isolation structure is formed in the second opening and comprises a first isolation segment and a second isolation segment respectively in the second opening segments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor structure, the method comprising:
   forming a photodetector in a first side of a substrate;
   forming a first dielectric layer on the first side of the substrate;
   patterning the first dielectric layer to form a first opening in the first dielectric layer, the first opening having a pair of first opening segments that uncover the first side of the substrate, wherein the first opening segments border the photodetector respectively on opposite sides of the photodetector;

forming a dummy contact structure in the first opening, the dummy contact structure comprising a first dummy segment and a second dummy segment respectively in the first opening segments, and the dummy contact structure comprising a metal extending laterally through the first dielectric layer in a closed path along a boundary of the photodetector;

patterning a second side of the substrate, opposite the first side, to form a second opening having a pair of second opening segments that are aligned to the first dummy segment and the second dummy segment, respectively; and forming a substrate isolation structure in the second opening, the substrate isolation structure comprising a first isolation segment and a second isolation segment respectively in the second opening segments.

2. The method of claim 1, wherein forming the substrate isolation structure comprises:
depositing a second dielectric layer in the second opening and on upper surfaces of the first and second dummy segments.

3. The method of claim 1, wherein the substrate isolation structure extends through the substrate from the second side of the substrate to an upper surface of the dummy contact structure.

4. The method of claim 1, wherein the opposite sides of the photodetector comprise a first side of the photodetector and a second side of the photodetector, opposite the first side of the photodetector, and wherein the method further comprises:
forming a metal reflector directly contacting the first dummy segment and the second dummy segment, wherein the metal reflector laterally extends from the first side of the photodetector to the second side of the photodetector.

5. The method of claim 1, wherein the patterning of the second side of the substrate comprises etching through the substrate from the second side to the dummy contact structure.

6. The method of claim 1, wherein forming the dummy contact structure comprises depositing the metal in the first opening and on the first side of the substrate.

7. The method of claim 6, wherein the dummy contact structure has a ring-shaped top layout, and wherein the substrate isolation structure directly overlies and directly contacts the dummy contact structure, and further extends laterally along the closed path.

8. A method for forming an image sensor, the method comprising:
forming a photodetector along a first surface of a semiconductor substrate;
depositing a first dielectric layer on the first surface of the semiconductor substrate;
patterning the first dielectric layer to form a first opening in the first dielectric layer that uncovers a portion of the first surface of the semiconductor substrate, wherein the first opening extends along a perimeter of the photodetector;
depositing a first conductive layer in the first opening to form a dummy contact in the first opening;
depositing a second dielectric layer over the first dielectric layer;
forming a metal reflector within the second dielectric layer, the metal reflector continuously extending directly over the dummy contact, the first dielectric layer, and the photodetector;
patterning a second surface of the semiconductor substrate, opposite the first surface, to form a second opening in the semiconductor substrate that uncovers a portion of a surface of the dummy contact; and
depositing a dielectric in the second opening to form a substrate isolation structure in the second opening, the substrate isolation structure being arranged directly over the dummy contact and the semiconductor substrate.

9. The method of claim 8, wherein the dummy contact comprises a metal, wherein the dummy contact continuously extends vertically through the first dielectric layer from an uppermost surface of the metal reflector to a lowermost surface of the substrate isolation structure and to the first surface of the semiconductor substrate, and wherein the dummy contact extends laterally through the first dielectric layer along the perimeter of the photodetector in a closed path.

10. The method of claim 8, further comprising:
forming a composite metal grid over the second surface of the semiconductor substrate, directly over the dummy contact, and directly over the substrate isolation structure.

11. The method of claim 8, further comprising:
patterning the first dielectric layer to form a contact opening in the first dielectric layer; and
depositing the first conductive layer in the contact opening to form a first contact in the contact opening, wherein the first contact is arranged directly between segments of the dummy contact.

12. The method of claim 11, wherein the metal reflector is formed on both the first contact and the dummy contact.

13. The method of claim 8, wherein forming the metal reflector comprises patterning the second dielectric layer to form a reflector opening in the second dielectric layer, the reflector opening that uncovering the dummy contact and laterally extending from a first side of the photodetector to a second side of the photodetector, opposite the first side, and wherein forming the metal reflector comprises depositing a metal in the reflector opening and on the dummy contact.

14. The method of claim 8, further comprising:
forming a first etch-stop layer along the first surface of the semiconductor substrate before depositing the first dielectric layer on the first surface; and
patterning the first etch-stop layer after patterning the first dielectric layer such that the first opening extends through the first etch-stop layer to the first surface of the semiconductor substrate.

15. A method for forming an image sensor, the method comprising:
forming a photodetector along a first side of a semiconductor substrate;
depositing a first dielectric layer on the first side of the semiconductor substrate;
etching the first dielectric layer to form a first opening having a pair of first opening segments that uncover a portion the first side of the semiconductor substrate, wherein the pair of first opening segments are arranged on opposite sides of the photodetector;
forming a dummy contact structure comprising a first dummy segment and a second dummy segment respectively in the pair of first opening segments;
forming a metal layer directly over the dummy contact structure and directly contacting the first dummy segment and the second dummy segment;

etching the semiconductor substrate from a second side of the semiconductor substrate, opposite the first side, to form a second opening having a pair of second opening segments that uncover topmost surfaces of the first dummy segment and the second dummy segment, respectively; and depositing a dielectric over the second side of the semiconductor substrate to form a substrate isolation structure comprising a first isolation segment and a second isolation segment respectively in the second opening segments, wherein the first isolation segment directly contacts the first dummy segment and the second isolation segment directly contacts the second dummy segment.

16. The method of claim 15, wherein both the first dummy segment and the second dummy segment comprise metal and extend continuously from the metal layer to the first isolation segment and the second isolation segment, respectively.

17. The method of claim 15, wherein the dummy contact structure comprises a metal, and wherein the dummy contact structure continuously extends through the first dielectric layer and along a boundary of the photodetector in a closed path.

18. The method of claim 17, wherein the substrate isolation structure continuously extends along the dummy contact structure in the closed path, and wherein the first isolation segment and the second isolation segment are formed directly over the metal layer.

19. The method of claim 15, further comprising:
forming a pixel transistor along the semiconductor substrate; and
forming a transistor contact in the first dielectric layer and directly contacting the pixel transistor, wherein the metal layer is coupled to both the transistor contact and the dummy contact structure.

20. The method of claim 15, wherein the metal layer laterally extends between the opposite sides of the photodetector from directly under both the first dummy segment and the first isolation segment to directly under both the second dummy segment and the second isolation segment.

* * * * *